United States Patent
Siemieniec et al.

(10) Patent No.: US 11,043,560 B2
(45) Date of Patent: Jun. 22, 2021

(54) SILICON CARBIDE SEMICONDUCTOR COMPONENT COMPRISING TRENCH GATE STRUCTURES AND SHIELDING REGIONS

(71) Applicant: Infineon Technologies AG, Neubiberg (DE)

(72) Inventors: Ralf Siemieniec, Villach (AT); Wolfgang Bergner, Klagenfurt (AT)

(73) Assignee: Infineon Technologies AG, Neubiberg (DE)

(*) Notice: Subject to any disclaimer, the term of this patent is extended or adjusted under 35 U.S.C. 154(b) by 48 days.

(21) Appl. No.: 16/205,887

(22) Filed: Nov. 30, 2018

(65) Prior Publication Data

US 2019/0172910 A1 Jun. 6, 2019

(30) Foreign Application Priority Data

Dec. 1, 2017 (DE) .......................... 102017128633.0

(51) Int. Cl.
*H01L 31/0312* (2006.01)
*H01L 29/15* (2006.01)
(Continued)

(52) U.S. Cl.
CPC ...... *H01L 29/0852* (2013.01); *H01L 29/1608* (2013.01); *H01L 29/41741* (2013.01);
(Continued)

(58) Field of Classification Search
CPC ........... H01L 29/0852; H01L 29/41741; H01L 29/7806; H01L 29/7813; H01L 29/1608; H01L 29/66068; H01L 29/4236; H01L 21/0485; H01L 21/0465; H01L 21/0495; H01L 21/049; H01L 29/41766; H01L 29/1095; H01L 29/0623
See application file for complete search history.

(56) References Cited

U.S. PATENT DOCUMENTS 5,719,409 A  2/1998 Singh et al.
8,704,295 B1 * 4/2014 Darwish ........... H01L 29/66727
                                                257/330
(Continued)

OTHER PUBLICATIONS

Foster, Derrick W., et al., "An In-Situ Phosphorus Doped Polysilicon Deposition Process Optimized for Production", V-MIC Conference, Jun. 9-10, 1986, IEEE, pp. 523-529.
(Continued)

*Primary Examiner* — Ismail A Muse
(74) *Attorney, Agent, or Firm* — Murphy, Bilak & Homiller, PLLC

(57) ABSTRACT

A semiconductor component includes gate structures extending into a silicon carbide body from a first surface. A width of the gate structures along a first horizontal direction parallel to the first surface is less than a vertical extent of the gate structures perpendicular to the first surface. Contact structures extend into the silicon carbide body from the first surface. The gate structures and the contact structures alternate along the first horizontal direction. Shielding regions in the silicon carbide body adjoin a bottom of the contact structures and are spaced apart from the gate structures along the first horizontal direction. Corresponding methods for producing the semiconductor component are also described.

22 Claims, 23 Drawing Sheets

(51) Int. Cl.
  H01L 29/08    (2006.01)
  H01L 29/417   (2006.01)
  H01L 29/78    (2006.01)
  H01L 29/16    (2006.01)
  H01L 29/66    (2006.01)
  H01L 29/423   (2006.01)
  H01L 21/04    (2006.01)

(52) U.S. Cl.
  CPC .... H01L 29/4236 (2013.01); H01L 29/66068 (2013.01); H01L 29/7806 (2013.01); H01L 29/7813 (2013.01); *H01L 21/049* (2013.01); *H01L 21/0465* (2013.01); *H01L 21/0485* (2013.01); *H01L 21/0495* (2013.01)

(56) References Cited

U.S. PATENT DOCUMENTS

| | | | |
|---|---|---|---|
| 2008/0121986 A1 | 5/2008 | Hshieh | |
| 2009/0206924 A1* | 8/2009 | Zeng | H01L 29/7813 327/581 |
| 2011/0254088 A1* | 10/2011 | Darwish | H01L 29/66727 257/340 |
| 2012/0032258 A1* | 2/2012 | Zeng | H01L 29/407 257/330 |
| 2012/0043602 A1* | 2/2012 | Zeng | H01L 29/66727 257/330 |
| 2013/0164895 A1* | 6/2013 | Zeng | H01L 29/407 438/270 |
| 2014/0042525 A1* | 2/2014 | Darwish | H01L 29/66734 257/329 |
| 2014/0042535 A1* | 2/2014 | Darwish | H01L 29/1095 257/334 |
| 2014/0252463 A1* | 9/2014 | Darwish | H01L 29/407 257/330 |
| 2015/0214336 A1* | 7/2015 | Darwish | H01L 21/823437 257/334 |
| 2015/0340360 A1* | 11/2015 | Darwish | H01L 29/36 257/329 |
| 2016/0049392 A1* | 2/2016 | Bhalla | H01L 29/0696 257/401 |
| 2016/0211364 A1* | 7/2016 | Zeng | H01L 29/063 |
| 2016/0260709 A1* | 9/2016 | Rupp | H01L 27/0664 |
| 2017/0162458 A1* | 6/2017 | Onozawa | H01L 22/30 |
| 2018/0138293 A1* | 5/2018 | Darwish | H01L 21/823475 |
| 2018/0158920 A1* | 6/2018 | Siemieniec | H01L 29/04 |
| 2018/0277637 A1* | 9/2018 | Meiser | H01L 29/0623 |
| 2018/0323285 A1* | 11/2018 | Darwish | H01L 29/7395 |
| 2018/0331204 A1* | 11/2018 | Aichinger | G06F 30/398 |
| 2018/0358449 A1* | 12/2018 | Zeng | H01L 29/4236 |
| 2018/0366569 A1* | 12/2018 | Zeng | H01L 29/1095 |
| 2019/0097025 A1* | 3/2019 | Darwish | H01L 21/823437 |
| 2019/0109228 A1* | 4/2019 | Kobayashi | H01L 29/1095 |
| 2020/0144370 A1* | 5/2020 | Grasse | H01L 29/0696 |

OTHER PUBLICATIONS

Nakamura, T., et al., "High Performance SiC Trench Devices with Ultra-low Ron", 2011 International Electron Devices Meeting, Dec. 2011.

Tanaka, Rina, et al., "Impact of Grounding the Bottom Oxide Protection Layer on the Short-Circuit Ruggedness of 4H-SiC Trench MOSFETs", Proceedings of the 26th International Symposium on Power Semiconductor Devices & IC's, Jun. 15-19, 2014 Waikoloa, Hawaii, pp. 75-78.

* cited by examiner

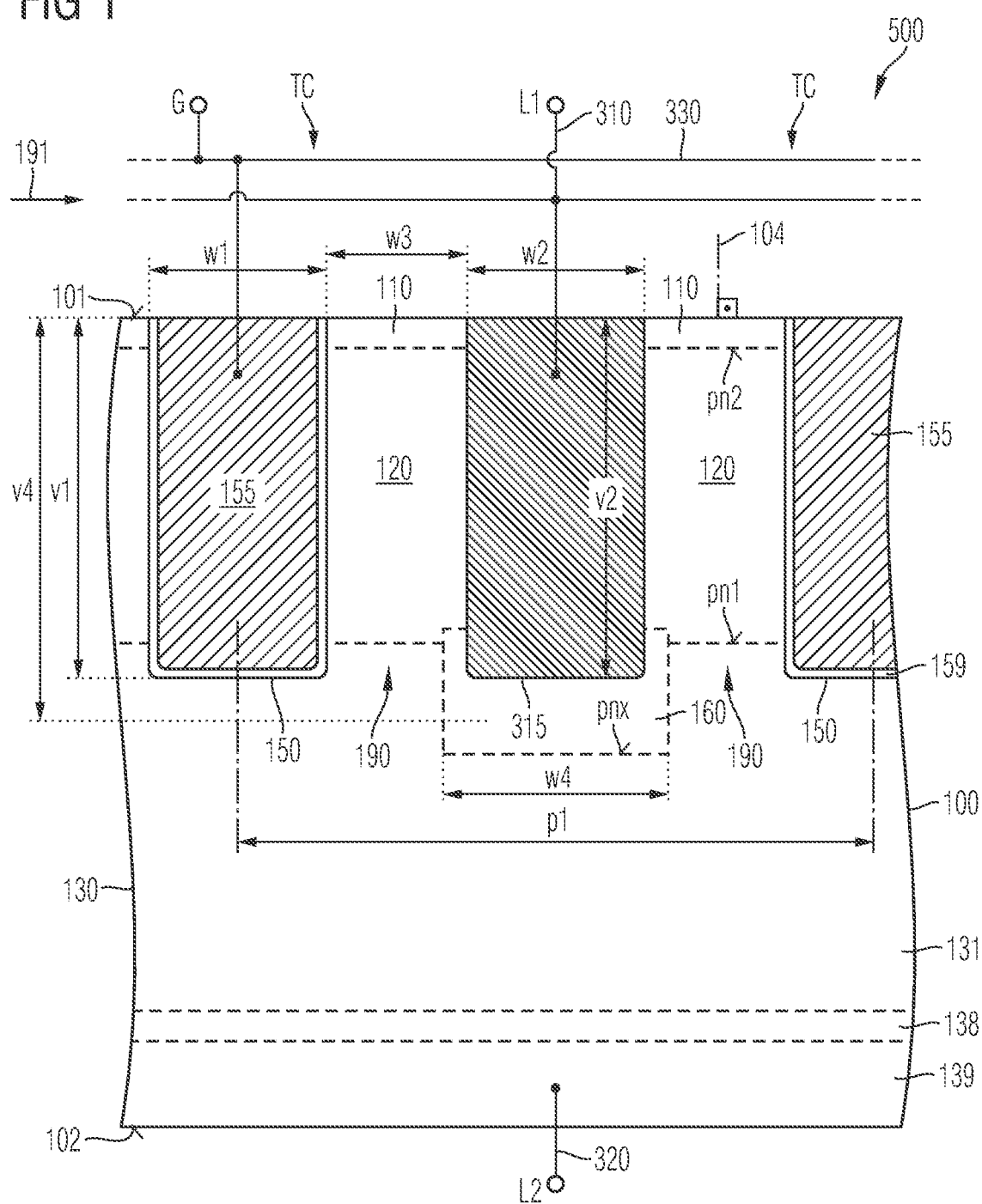

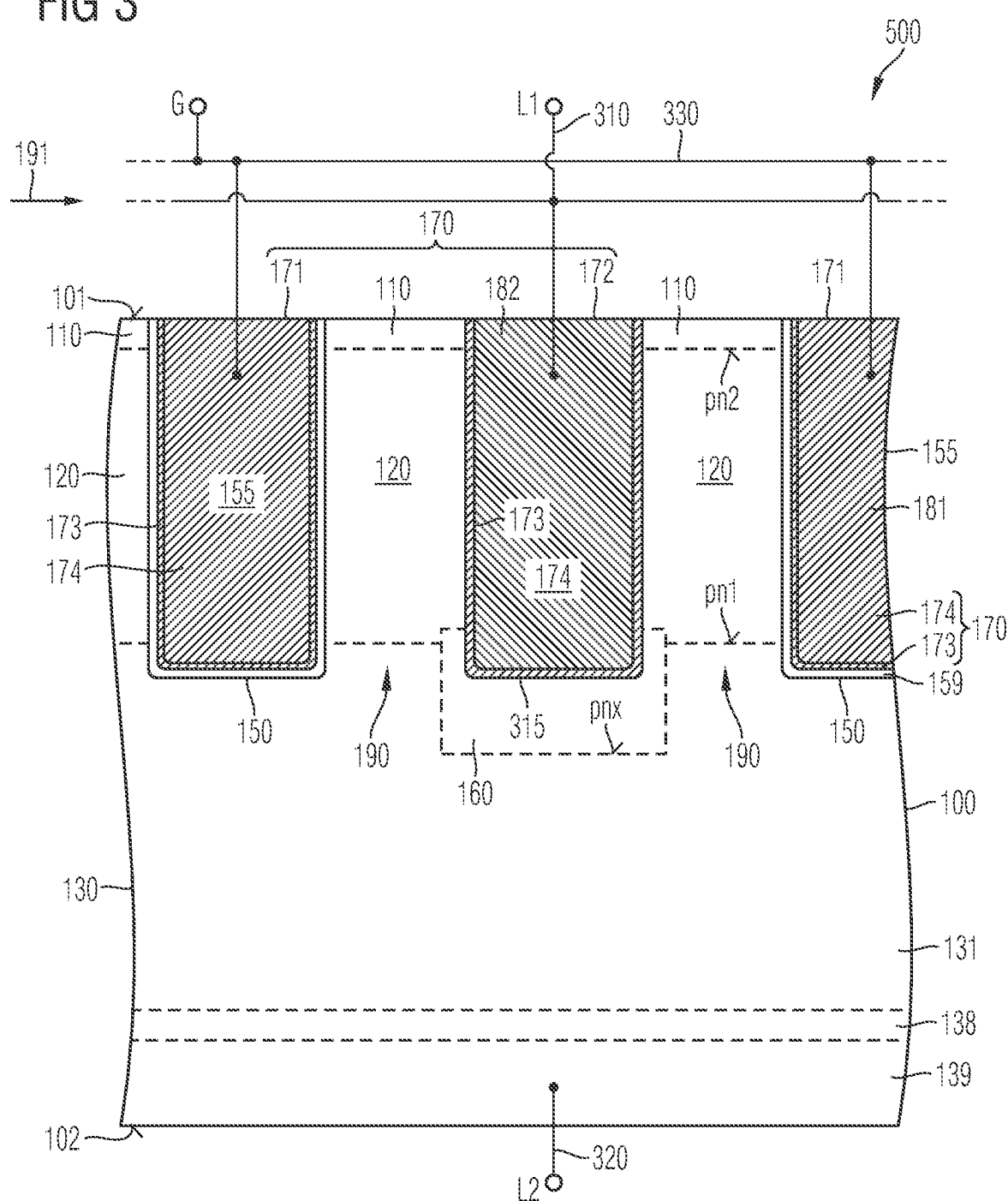

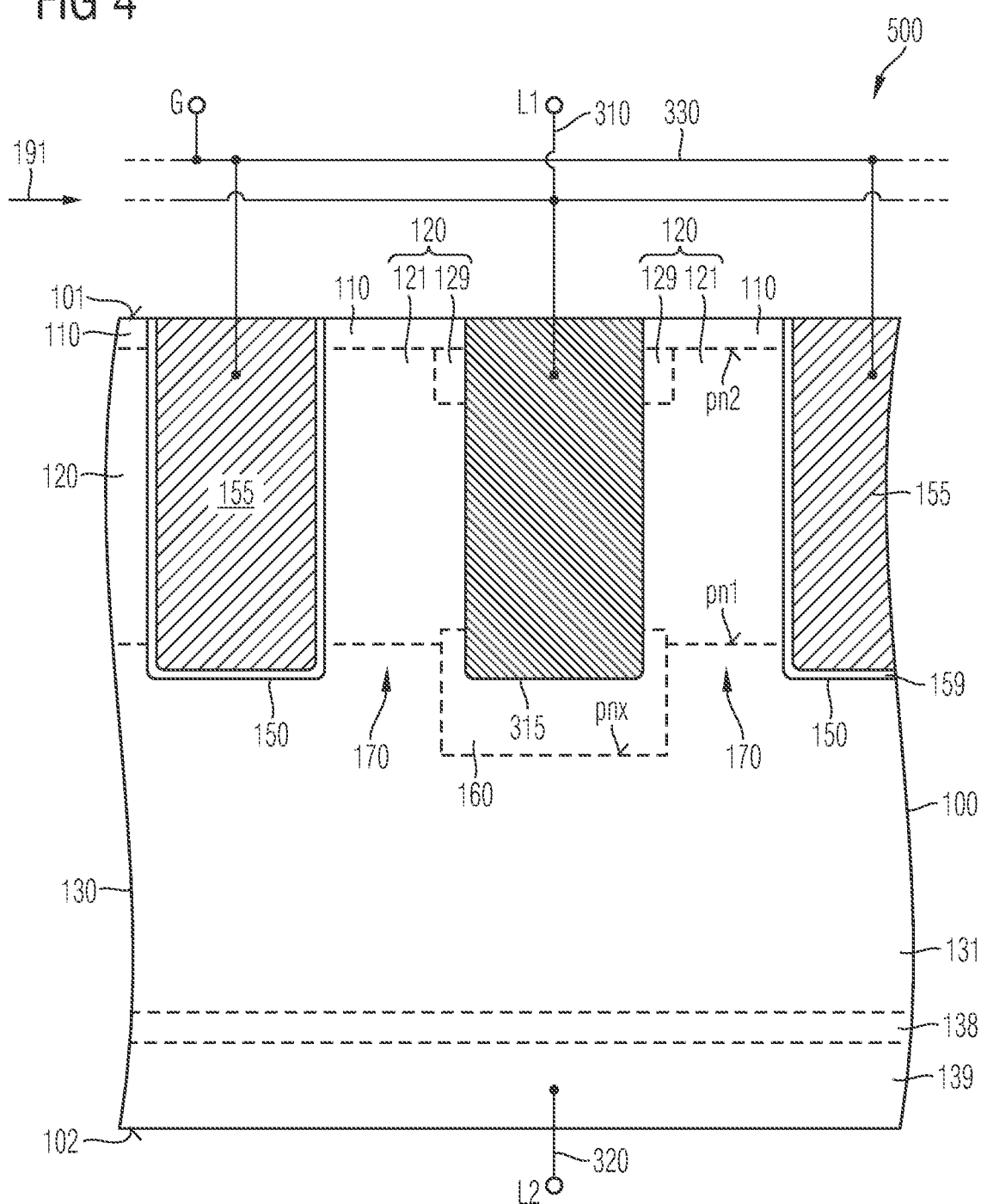

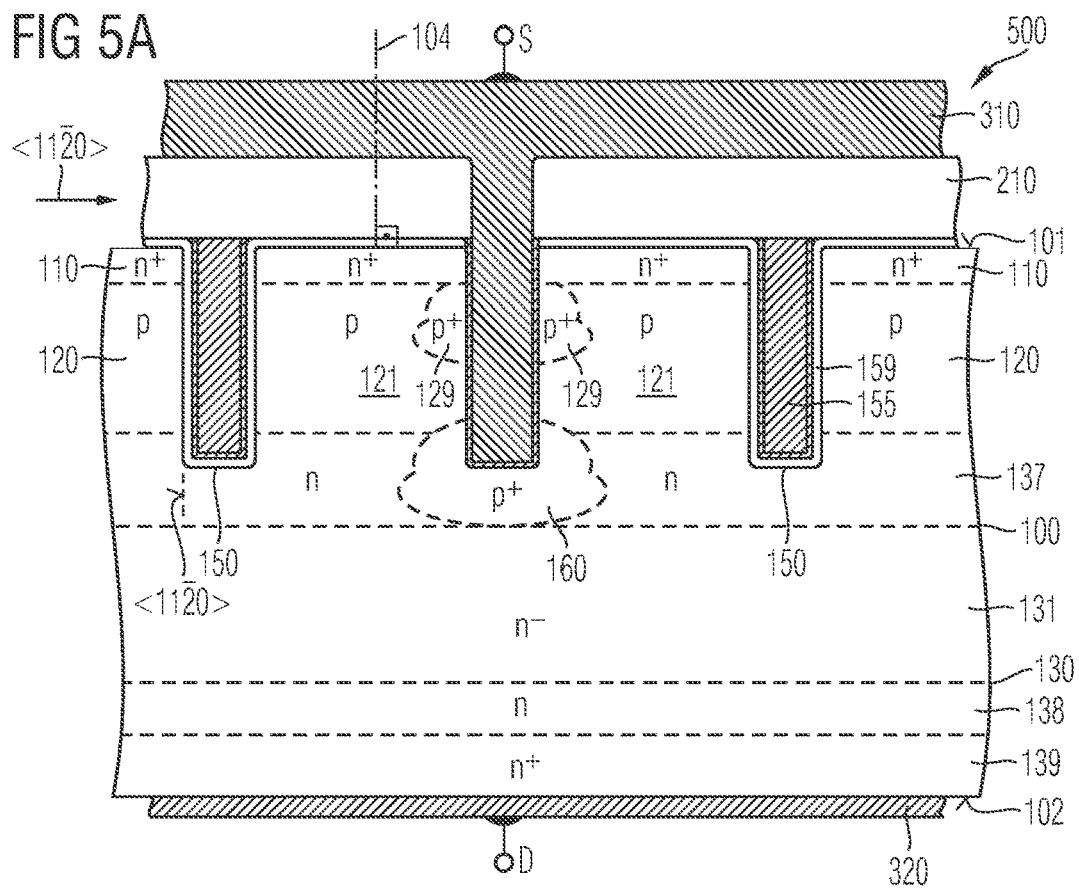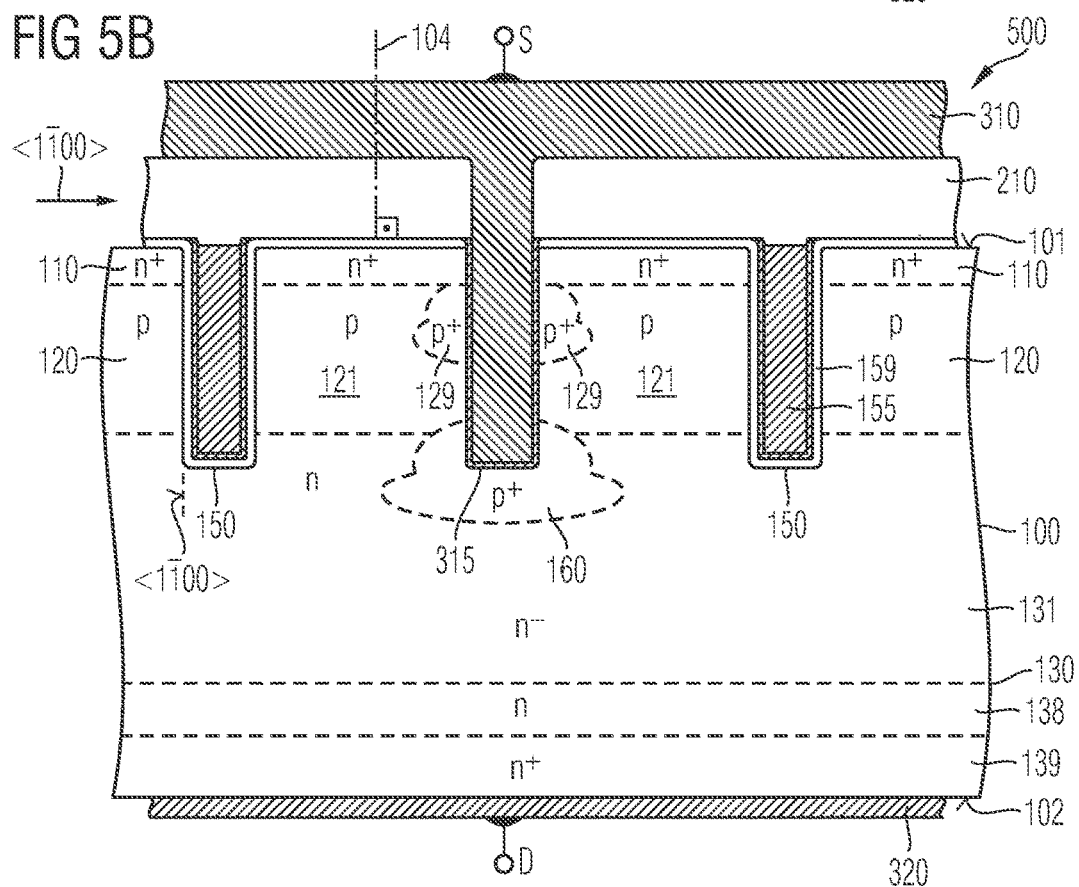

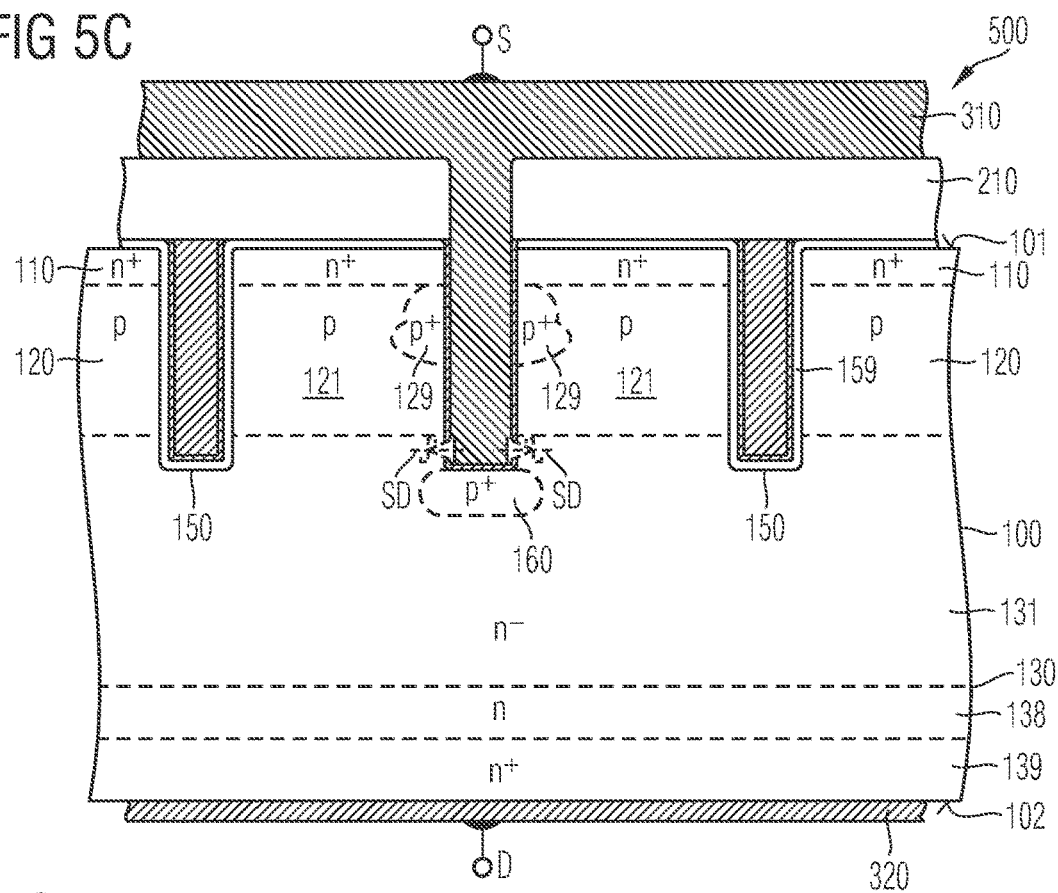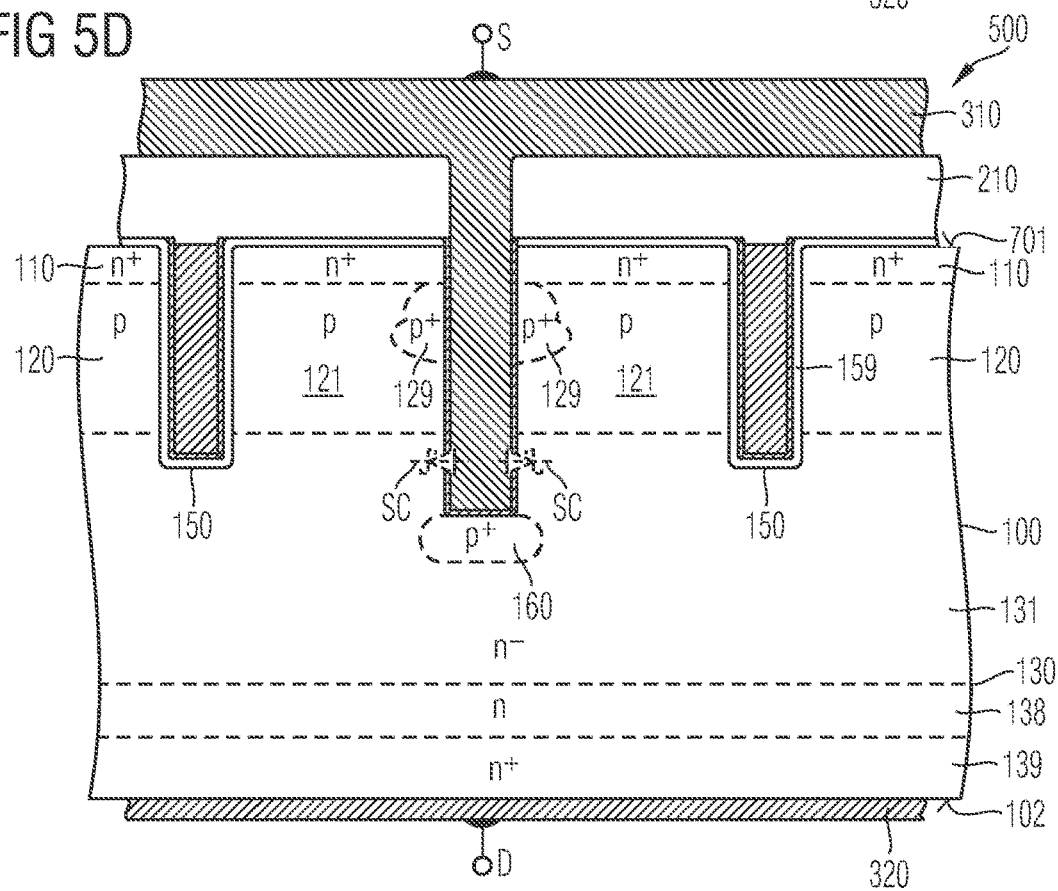

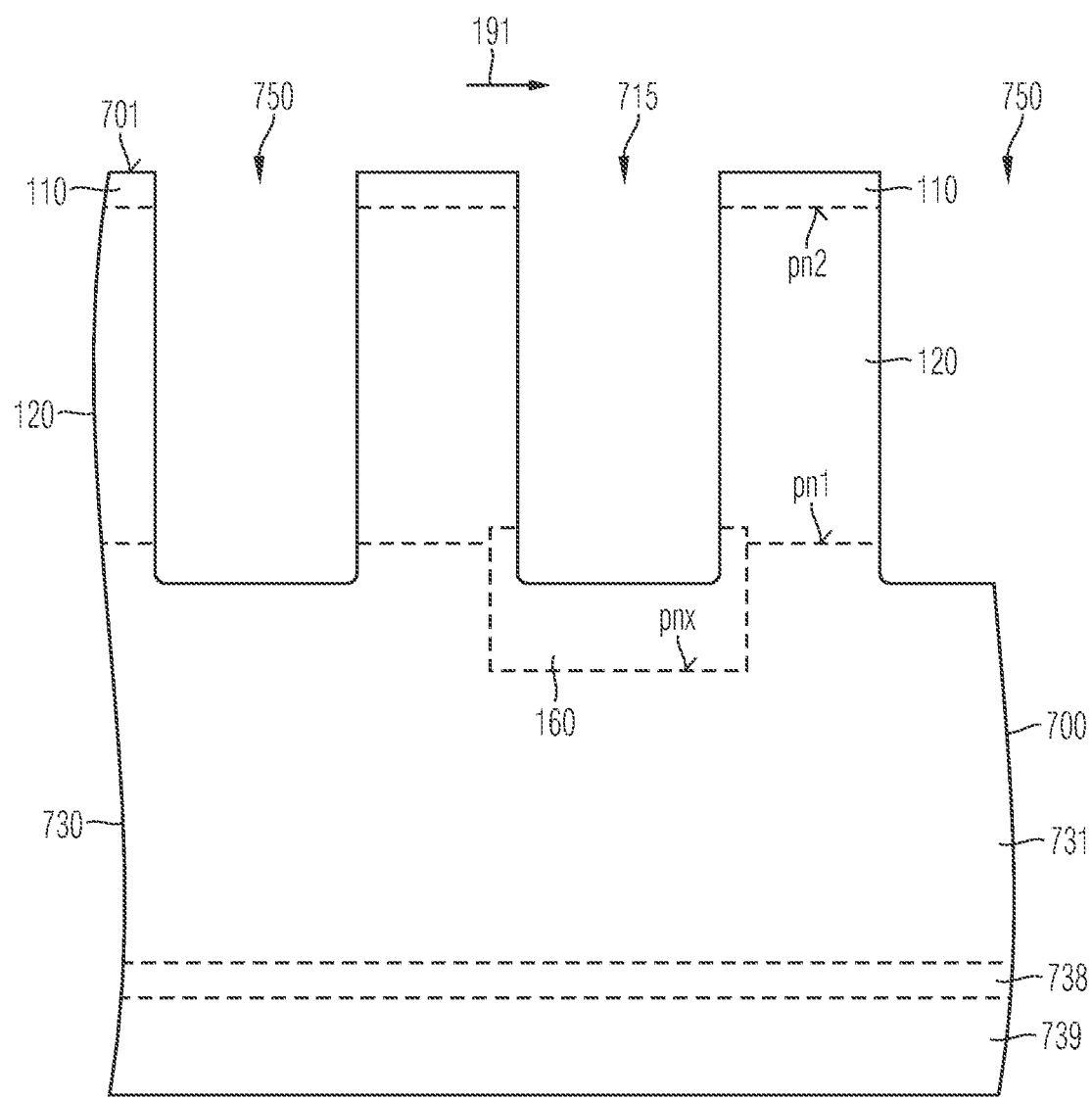

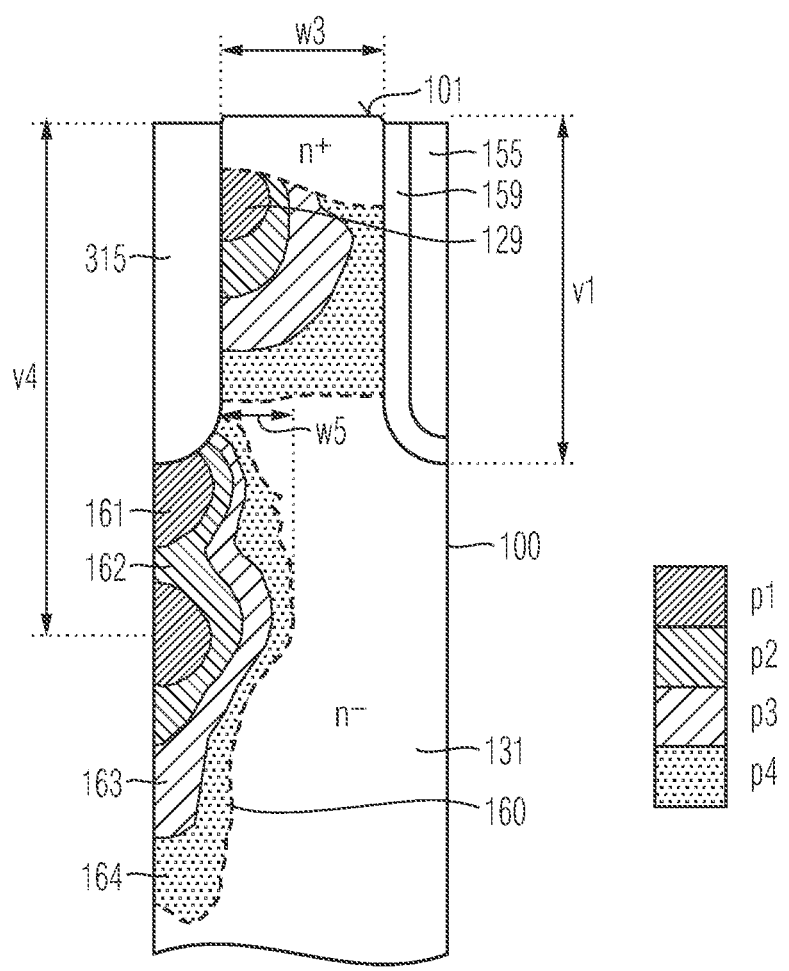

SILICON CARBIDE SEMICONDUCTOR COMPONENT COMPRISING TRENCH GATE STRUCTURES AND SHIELDING REGIONS

BACKGROUND

Semiconductor components based on silicon carbide (SiC) benefit from the high band gap and the high breakdown strength of silicon carbide. However, a high number of interfacial states form at interfaces between a SiC semiconductor body and a dielectric layer, for example the gate dielectric of a transistor cell of a SiC MOSFET (SiC metal oxide semiconductor field effect transistor), which interfacial states may be occupied by more or fewer charge carriers depending on the operating state of the SiC MOSFET. Charge carriers that occupy the interfacial states influence the mobility and the concentration of free charge carriers that form the field-controlled transistor channel in the on state of the transistor cells. Moreover, the high breakdown strength of SiC is usually not fully utilized since the field strength occurring in the gate dielectric and the reliability of the gate dielectric often limit the dielectric strength of the SiC MOSFET.

The present application is directed to a SiC semiconductor component that can utilize the intrinsic electric breakdown field strength of silicon carbide to a high degree.

SUMMARY

The present disclosure relates to a semiconductor component comprising gate structures, contact structures and shielding regions. The gate structures extend into a silicon carbide body from a first surface. A width of the gate structures along a first horizontal direction parallel to the first surface is less than a vertical extent of the gate structures perpendicular to the first surface. The contact structures likewise extend into the silicon carbide body from the first surface. The gate structures and the contact structures alternate along the first horizontal direction. The shielding regions are formed in the silicon carbide body in a manner adjoining a bottom of the contact structures and spaced apart from the gate structures along the first horizontal direction.

The present disclosure additionally relates to a semiconductor component comprising gate structures and contact structures extending into a silicon carbide body in each case from a first surface. The gate structures and the contact structures alternate with one another along a first horizontal direction parallel to the first surface. Body regions are formed in mesa sections of the silicon carbide body between the gate structures and the contact structures. Shielding regions of a conductivity type of the body regions are formed along the bottom of the contact structures and are spaced apart from the gate structures along the first horizontal direction. A drift structure comprising a drift zone forms first pn junctions with the body regions and Schottky contacts with the contact structures.

The present disclosure furthermore relates to a semiconductor component comprising gate structures and contact structures extending into a silicon carbide body in each case from a first surface, wherein the gate structures and the contact structures alternate with one another along a first horizontal direction parallel to the first surface. The gate structures comprise a gate dielectric and a gate electrode, wherein the gate electrode comprises first sections of a metal structure that adjoin the gate dielectric. The contact structures comprise second sections of the metal structure that adjoin the silicon carbide body. In the silicon carbide body shielding regions are formed along the bottom of the contact structures, said shielding regions being spaced apart from the gate structures along the first horizontal direction.

The present disclosure also relates to a method for producing a semiconductor component. A silicon carbide substrate is formed, comprising a main layer, a body layer formed on a section of the main layer, and a source layer formed on a section of the body layer, wherein a conductivity type of the body layer is opposite to a conductivity type of the source layer and of a drift layer formed in the main layer. Gate trenches and contact trenches are formed, which extend through the source layer and the body layer and which alternate along a first horizontal direction parallel to a first main surface of the silicon carbide substrate. A gate dielectric is formed in the gate trenches. A metal structure is formed, which comprises first sections adjoining the gate dielectric in the gate trenches and second sections in the contact trenches. The second sections adjoin body regions formed from sections of the body layer and source regions formed from sections of the source layer. Third sections of the metal structure that connect the first sections to the second sections are removed.

Further features and advantages of the subject matter as disclosed will be evident to the person skilled in the art upon reading the following detailed description and upon looking at the drawings.

BRIEF DESCRIPTION OF THE DRAWINGS

The enclosed drawings convey a deeper understanding of the invention, are included in the disclosure and form part thereof. The drawings illustrate embodiments of the present invention and together with the description elucidate the principles of the invention. Further embodiments of the invention and intended advantages will become apparent from the understanding of the following detailed description.

FIG. 1 is a schematic cross section of a section of a SiC semiconductor component comprising trench gates and trench contacts in accordance with one embodiment with an aspect ratio of the gate structures that is greater than 1.

FIG. 3 is a schematic cross section of a section of a SiC semiconductor component comprising trench gates and trench contacts in accordance with one embodiment with a metal structure comprising first sections in the trench gates and second sections in the trench contacts.

FIG. 4 is a schematic cross section through a section of a SiC semiconductor component in accordance with one embodiment with body regions comprising more highly doped contact sections along trench contacts.

FIG. 5A is a schematic cross section through a section of a SiC semiconductor component comprising trench gates and trench contacts in accordance with one embodiment with trench gates whose sidewalls extend parallel to (11-20) lattice planes.

FIG. 5B is a schematic cross section through a section of a SiC semiconductor component in accordance with a further embodiment with trench gates whose sidewalls extend parallel to (1-100) lattice planes.

FIG. 5C is a schematic cross section through a section of a SiC semiconductor component in accordance with a further embodiment with highly doped contact sections and Schottky contacts to trench contacts.

FIG. 5D is a schematic cross section through a section of a SiC semiconductor component in accordance with a further embodiment with highly doped contact sections, shielding regions and Schottky contacts along deep trench contacts.

FIG. 7B is a schematic cross section of the section of the silicon carbide substrate from FIG. 7A after introducing gate trenches and contact trenches.

FIG. 10 is a schematic illustration of a dopant distribution in shielding regions in a cross section through a section of a SiC semiconductor component in accordance with one embodiment.

DETAILED DESCRIPTION

Figure 2A:
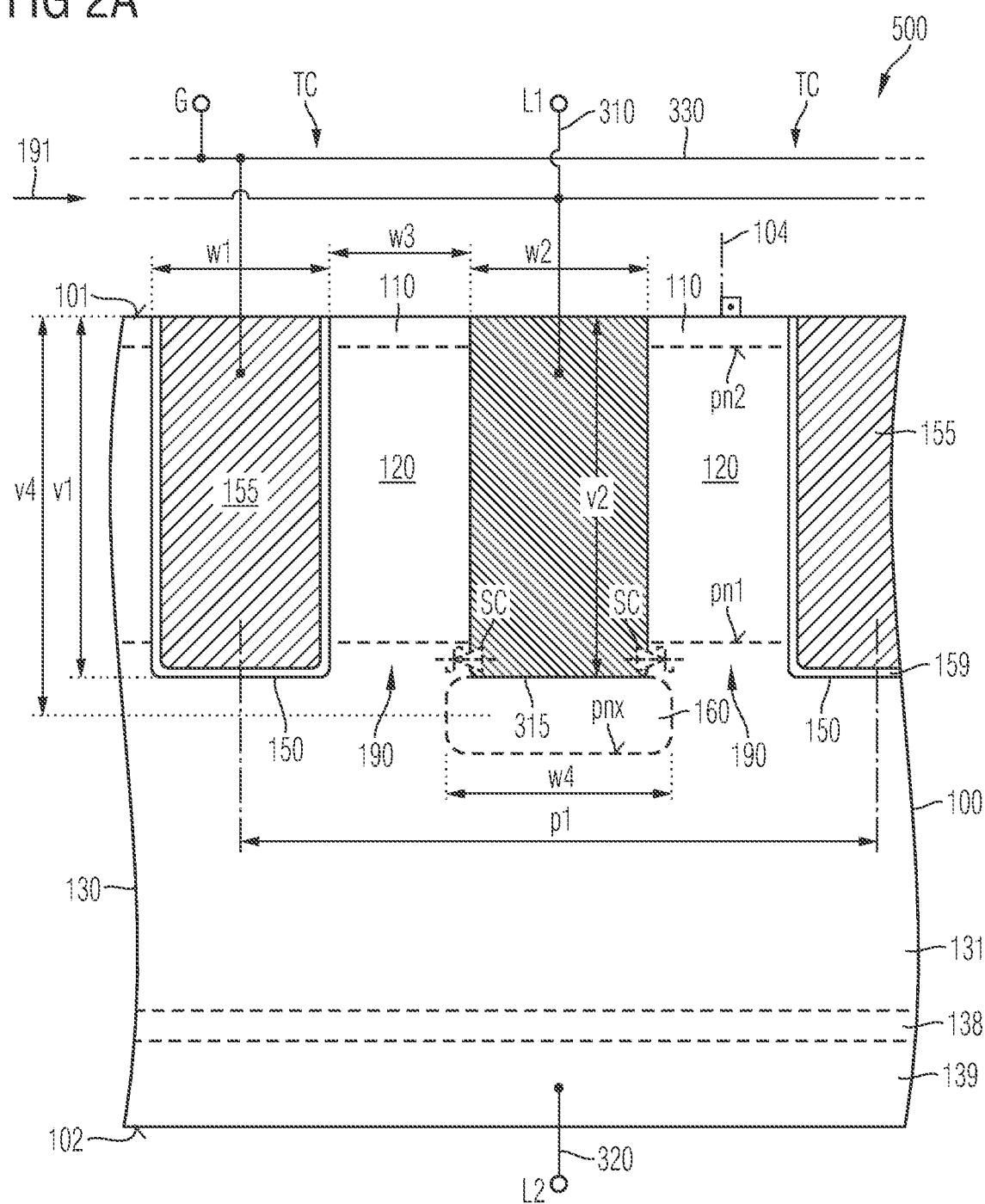
FIG. 2A is a schematic cross section through a section of a SiC semiconductor component comprising trench gates and trench contacts in accordance with one embodiment with Schottky contacts at the trench contacts, wherein a vertical extent of the trench contacts corresponds to a vertical extent of the trench gates.

In the following detailed description, reference is made to the accompanying drawings, which form part of the disclosure and show for illustration purposes specific exemplary embodiments. In this context, direction terminology such as "top side", "bottom", "front side", "rear side", "at the front", "at the back" etc. relates to the orientation of the figures being described. Since the component parts in the exemplary embodiments can be positioned in different orientations, the direction terminology serves only for elucidation and should in no way be interpreted as limiting.

The terms "have", "contain", "encompass", "comprise" and the like hereinafter are open terms which on the one hand indicate the presence of said elements or features, and on the other hand do not exclude the presence of further elements or features. The indefinite articles and the definite articles encompass both the plural and the singular, unless something to the contrary is clearly evident from the context.

Some figures represent relative dopant concentrations by the indication "−" or "+" next to the doping type. By way of example, "n−" means a dopant concentration that is less than the dopant concentration of an "n"-doped region, while an "n+"-doped region has a higher dopant concentration than the "n"-doped region. The indication of the relative dopant concentration does not mean that doped regions having the same relative dopant concentration indication must have the same absolute dopant concentration, unless stated otherwise.

By way of example, two different "n"-doped regions may have the same or different absolute dopant concentrations.

The term "electrically connected" describes a low-impedance connection between the electrically connected elements, for example a direct contact between the relevant elements or a connection via a metal and/or a highly doped semiconductor. The expression "electrically coupled" includes the fact that one or more intervening elements suitable for signal transmission can be present between the electrically coupled elements, e.g. elements which are controllable such that they can establish a low-impedance connection in a first state and a high-impedance decoupling in a second state.

FIG. 1 shows a semiconductor component 500 comprising transistor cells TC. The semiconductor component 500 can be an IGFET (insulated gate field effect transistor), for example a MOSFET (metal oxide semiconductor FET), an IGBT (insulated gate bipolar transistor) or an MCD (MOS-controlled diode), wherein the semiconductor component 500 can comprise even further semiconductor elements besides the transistor cells TC, for example one or more diode structures, for instance a pn diode and/or a Schottky diode.

The semiconductor component 500 is based on a silicon carbide body 100 composed of crystalline silicon carbide (SiC), e.g. 2H SiC (SiC of the 2H polytype), 6H SiC or 15R SiC. In accordance with one embodiment, the material of the silicon carbide body 100 is 4H SiC. A first surface 101 on the front side of the silicon carbide body 100 is planar or ribbed. A normal 104 to a planar first surface 101 or to a central plane of a ribbed first surface 101 defines a vertical direction. Directions parallel to a planar first surface 101 or to the central plane of a ribbed first surface 101 are horizontal or lateral directions.

On the rear side, the silicon carbide body 100 has a second surface 102 parallel to the first surface 101. The total thickness of the silicon carbide body 100 between the first surface 101 and the second surface 102 can be hundreds of nanometers to a number of micrometers.

A drift structure 130 is formed in the silicon carbide body 100, said drift structure comprising at least one highly doped contact section 139 along the second surface 102 and a more weakly doped drift zone 131 of a first conductivity type between the first surface 101 and the highly doped contact section 139. In the on state of the transistor cells TC, the load current flows in a vertical direction through the drift zone 131. Vertical extent and doping in the drift zone 131 substantially determine the blocking capability of the semiconductor component 500.

The drift structure 130 comprises all doped regions between the transistor cells TC and the second surface 102 and can comprise even further doped regions besides the drift zone 131 and the contact section 139, for example a buffer layer 138, which is significantly more highly doped than the drift zone 131 and which separates the drift zone 131 from the contact section 139, and also further doped regions of the conductivity type of the drift zone 131 between the transistor cells TC and the drift zone 131.

The transistor cells TC are formed along gate structures 150 extending into the silicon carbide body 100 from the first surface 101. The gate structures 150 can be aligned with the lattice of the crystalline silicon carbide body 100 such that both side faces of the gate structure 150 extend parallel to principal lattice planes of the silicon carbide body 100. By way of example, the two sidewalls of the gate structures 150 extending orthogonally to the cross-sectional plane lie in (11-20) lattice planes.

The gate structures 150 comprise a gate electrode 155, which can be electrically connected to a gate terminal G of the semiconductor component 500 e.g. via a gate metallization 330, and a gate dielectric 159, which separates the gate electrode 150 from the silicon carbide body 100. A layer thickness of the gate dielectric 159 can be less than 200 nm, for example less than 100 nm. The gate structures 150 can be strip gates, wherein a longitudinal extent along a second horizontal direction parallel to the first surface 101 and orthogonal to the cross-sectional plane is at least five times a width w1 of the gate structures 150 along a first horizontal direction 191 parallel to the first surface 101 in the cross-sectional plane.

Between two adjacent gate structures 150 in each case a contact structure 315 extends into the silicon carbide body 100 from the first surface 101. Gate structures 150 and contact structures 315 alternate along the first horizontal direction 191. One gate structure 150 and one contact structure 315 in each case laterally delimit a mesa section 190 of the silicon carbide body 100.

Body regions 120 of a second conductivity type complementary to the first conductivity type are formed in the mesa sections 190. In the mesa sections 190 the body regions 120 form first pn junctions pn1 with the drift structure 130, for example with the drift zone 131, and second pn junctions pn2 with source regions 110 formed between the first surface 101 and the body region 120. The source regions 110 and body regions 120 in each case directly adjoin the respective gate structure 150 and the contact structure 315.

Body regions 120 and source regions 110 of each transistor cell TC are electrically connected to a first load terminal L1 of the semiconductor component 500 via a first load electrode 310. The highly doped contact section 139 is electrically connected to a second load terminal L2 of the semiconductor component 500 via a second load electrode 320.

Shielding regions 160 are formed between the contact structures 315 and the drift structure 130, said shielding regions directly adjoining the bottom of the contact structures 315. The shielding regions 160 can adjoin the body regions 120, be formed symmetrically with respect to the center axis of the contact structures 315 and extend along lower sections of the vertical sidewalls of the contact structures 315. A horizontal width w4 of the shielding regions 160 parallel to the first horizontal direction 191 can be greater than a horizontal width w2 of the contact structures, but is dimensioned such that the shielding regions 160 are spaced apart laterally from the gate structures 150. A distance v4 between a maximum dopant concentration in the shielding regions 160 and the first surface 101 can be greater than the vertical extent v1 of the gate structures 150.

The gate electrode 155 comprises a metal structure or consists of a metal structure, wherein the metal structure can be composed of a plurality of partial layers composed of different materials. By way of example, the gate electrode 155 comprises a first partial layer composed of a first metal or composed of a first metal compound, which directly adjoins the gate dielectric 159, and a filling structure composed of a second metal or composed of a second metal compound.

The contact structures 315 are adjacent to the source regions 110, the body regions 120 and the shielding region 160 and likewise comprise a metal structure or consist of a metal structure, wherein the metal structure can comprise a plurality of partial layers of different compositions. The contact structures 315 and the gate electrodes 155 can have the same construction.

In a gate structure 150 based on a gate electrode 155 comprising a metal structure, the longitudinal resistance of the gate electrode 155 along the second horizontal direction remains sufficiently small even in the case of narrow gate structures 150, such that sufficiently homogeneous switching of the transistor cells TC can be ensured even if an aspect ratio of the gate structures 150, which is defined by the ratio of a vertical extent v1 of the gate structures 150 to the width thereof, is chosen to be greater than 1, e.g. greater than 1.5 or greater than 2.

The transistor cells TC can thus be packed more densely, the total width of field-controlled transistor channels in the semiconductor component 500 can be increased and the on resistance of the semiconductor component 500 can thus be drastically reduced. By way of example, a center-to-center distance p1 between adjacent gate structures 150 can be reduced to less than 2 µm, for example to less than 1 µm or less than 800 nm. The width w1 of the gate structures 150 can be provided such that it is less than 600 nm, for example less than 400 nm or less than 300 nm.

In addition, metallic gate lines formed above the first surface 101 for the low-impedance connection of such sections of the gate electrode 155 which are far away from a gate pad can be omitted. Omitting such gate lines on the front side of the component increases the proportion of active component area.

Since the trenches underlying the gate structures 150 and the contact structures 315 can be defined by means of the same photolithographic mask, the relative position of the gate structures 150 with respect to the contact structures 315 is defined very well and subject to hardly any fluctuations, such that the mesa sections 190 can also be made very narrow. By way of example, a mesa width w3 of the mesa sections 190 is less than 500 nm, for example less than 400 nm.

Owing to the low resistivity of the material of the gate electrode 155, the vertical extent v1 of the gate structures 150 and the vertical extent v2 of the contact structures 315 can also be reduced. With a smaller vertical extent v1 of the gate structures 150 and a smaller vertical extent v2 of the contact structures 315, moreover, the distance between the shielding regions 160 and the first surface 101 decreases and the implantation energy required for implanting the dopants defining shielding regions 160 becomes lower. Lower implantation energies in turn result in reduced lateral spreading of the dopants, such that this aspect also supports a smaller center-to-center distance p1 between adjacent gate structures 150 or transistor cells TC. Moreover, the implantation mask for defining the shielding regions 160 can be formed as a hard mask with reduced thickness or as a photoresist mask, which leads to a further reduction of the deviations of the lateral extent w4 of the shielding regions 160.

The width w2 of the contact structures 315 can likewise be less than 600 nm, for example less than 400 nm, for example a maximum of 300 nm, wherein the widths w2, w4 of the gate structures 150 and of the contact structures 315 can be equal in magnitude or can deviate slightly from one another. By way of example, the width w2 of the contact structures 315 can be greater than the width w1 of the gate structures 150 by at least 10%.

Moreover, the low-impedance connection of the shielding regions 160 via the contact structures 315 enables charge carriers to be rapidly carried away from and fed into the shielding regions 160 during switchover processes and thus improves the switching behavior of the semiconductor component 500.

The dopants for the shielding regions 160 can moreover be introduced via trenches formed beforehand for the contact structures 315, wherein the implantation can be carried out with comparatively low energy and the dopants therefore undergo little lateral spreading (straggling), such that the distance of the shielding regions 160 relative to the gate structures 150 is well defined and subjected to hardly any fluctuations; therefore, the width w4 of the shielding regions 160 is also able to be set very well and a small mesa width w3 is thus likewise supported. The shielding regions 160 reduce the influence of the drain potential on the body regions 120, such that the transistor cells TC can be provided with comparatively short channels, i.e. with a comparatively small vertical extent v1 of the gate structures 150. For a defined upper limit of the aspect ratio of the gate structures 150 in terms of production engineering, a reduction of the vertical extent v1 leads to a further contraction of the lateral width w1.

The implantation through the bottom of the contact trenches reduces the required implantation energy and thus also the probability of the generation of crystal defects in the silicon carbide body 100 that can subsequently lead to bipolar degradation effects.

FIG. 2A shows a semiconductor component 500 in which the shielding regions 160 are spaced apart from the body regions 120, such that lower sections of the sidewalls of the contact structures 315 directly adjoin the drift structure 130. By way of example, the drift zone 131 can adjoin the contact structures 315 or a further doped partial region of the drift structure 130, e.g. a current spreading layer, wherein the further partial region has the same conductivity type as the drift zone 131, directly adjoins the latter and has a higher dopant concentration than the drift zone 131, for example at least double, five times or ten times the dopant concentration thereof. The interfaces between the contact structures 315 and the drift structure 130 form Schottky contacts SC, which in their entirety act as a Schottky diode between the first load terminal L1 and the drift structure 130. In the case where the semiconductor component 500 is a SiC MOSFET, the Schottky contacts SC in their entirety act as a Schottky diode that is electrically connected in parallel with the intrinsic body diode.

The integration of the Schottky contacts SC into the transistor cells TC has the effect that in reverse operation of the semiconductor component 500, instead of a bipolar current via the third pn junctions pn3, firstly a unipolar current flows via the Schottky contacts SC. Since the threshold voltage of the Schottky diode formed by the Schottky contacts SC is lower than the threshold voltage of the pn diode formed by the third pn junctions, the Schottky contacts SC suppress a bipolar current flow within the drift zone 131 to a certain degree, and thus reduce the recombination of charge carriers in the drift zone 131 and local evolution of heat attributed to the recombination of the charge carriers. The Schottky contacts SC in this way suppress or damp the growth of stacking faults which, given sufficient heating, can propagate proceeding from crystal defects along principal lattice planes in the SiC crystal and adversely affect the on resistance Rdson of the transistor cells TC.

Figure 2B:
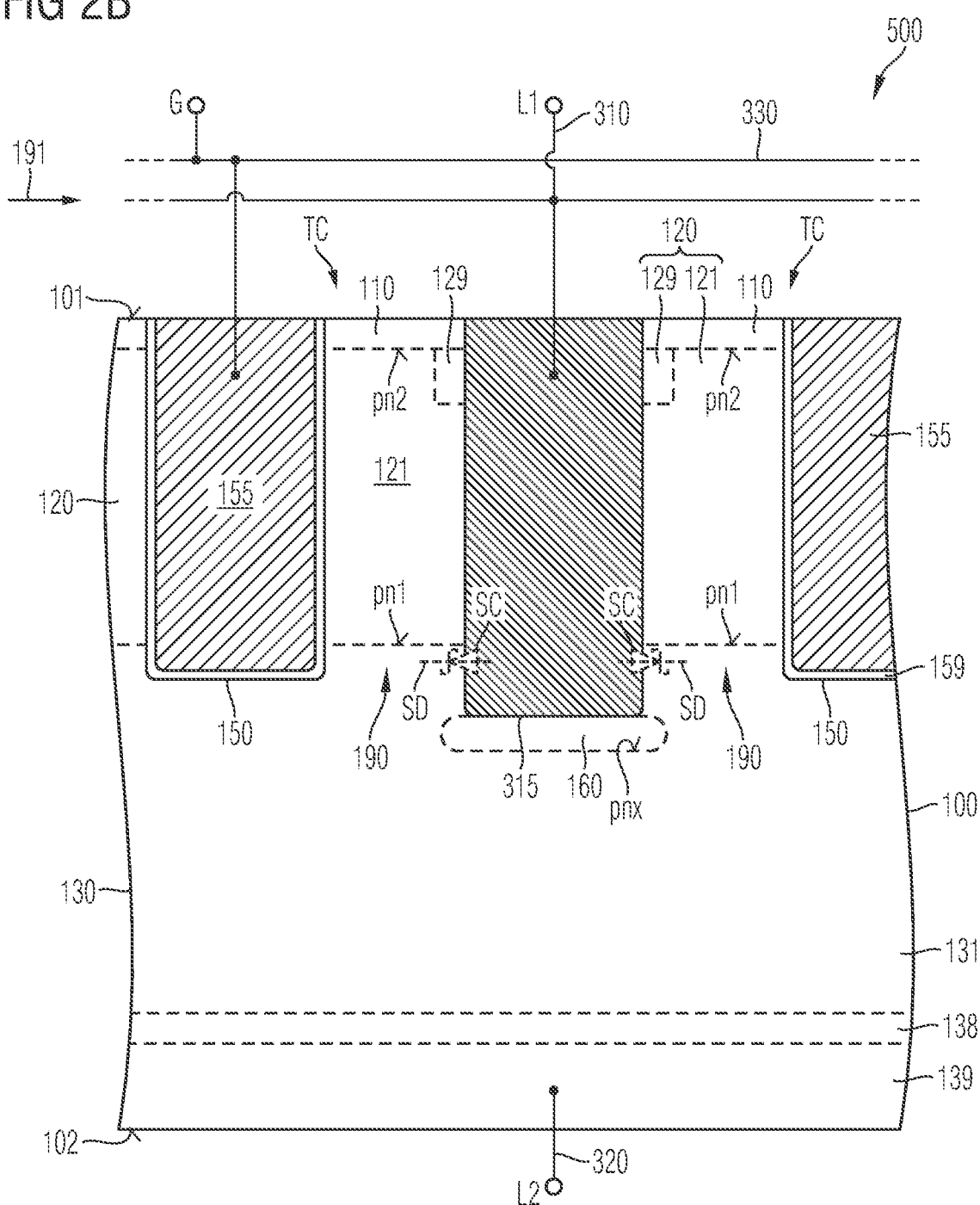
FIG. 2B is a schematic cross section through a section of a SiC semiconductor component in accordance with one embodiment with Schottky contacts at the trench contacts, wherein a vertical extent of the trench contacts is greater than that of the trench gates.

In FIG. 2B, the semiconductor component 500 comprises contact structures 315 whose vertical extent v2 is greater than the vertical extent v1 of the gate structures 150 and whose lateral width w2 can be slightly greater than the lateral width w1 of the gate structures 150. The effective area of the Schottky contacts SC is greater than in the embodiment in FIG. 2A. In addition, FIG. 2B shows body regions 120 comprising highly doped contact sections 129 along the contact structures 315, in which contact sections a dopant concentration is significantly higher than in main sections 121 of the body regions 120 outside the contact sections 129, for example at least double the magnitude of that in the main sections 121. Partial regions of the main sections 121 in which the transistor channels are formed are shielded vis-à-vis the contact sections 129 arranged laterally with respect thereto, as a result of which the depletion of these regions is reduced. The transistor cells TC can therefore be provided with shorter transistor channels, thereby enabling the mesa width to be reduced further.

FIG. 3 shows details of the gate electrode 155 and of the contact structure 315, wherein the gate electrodes 155 and contact structures 315 can have the same construction and be formed simultaneously. The gate electrodes 155 comprise first sections 171 of a metal structure 170 that adjoin the gate dielectric 159. The contact structures 315 form second sections 172 of the metal structure 170 that directly adjoin the silicon carbide body 100.

The metal structure 170 comprises at least one partial layer containing or consisting of a metal, a metal compound or a metal alloy. In accordance with one embodiment, the metal structure 170 comprises a first partial layer 173 and a second partial layer 174, wherein a first section of the first partial layer 173 in the gate structures 150 directly adjoins the gate dielectric 159 and a second section of the first partial layer 173 in the contact structures 315 directly adjoins the silicon carbide body 100.

The first partial layer 173 can be designed as an adhesion layer for the second partial layer 174. The first section of the first partial layer 173 can have a suitable work function for a threshold voltage of the transistor cells TC in the range of 1.5 V to 8 V. The second section of the first partial layer 173 can form a good ohmic contact with n-doped and with p-doped regions in silicon carbide.

The second section of the first partial layer 173 can have a different composition than the first section of the first partial layer 173. By way of example, the second section of the first partial layer 173 can comprise a metal-SiC material, which can contain at least partly silicided metal, for example a nickel silicide, a platinum silicide or a titanium silicide.

In accordance with one embodiment, the first section and the second section of the first partial layer 173 have the same composition. By way of example, the first section and the second section of the first partial layer 173 contain at least titanium (Ti), molybdenum (Mo) or tantalum (Ta). In accordance with one embodiment, both sections of the first partial layer 173 contain or consist of a titanium, titanium nitride, molybdenum, or molybdenum nitride, tantalum, or tantalum nitride layer.

The second partial layer 174 can contain a metal, a metal compound or a metal alloy having good filling properties. By way of example, the second partial layer 174 contains tungsten (W). A section of the second partial layer 174 in the second sections 172 of the metal structure 170 can have the same composition as a section of the second partial layer 174 in the first sections 171 of the metal structure 170.

FIG. 4 shows a semiconductor component 500 comprising body regions 120 having, along the contact structures 315, highly doped contact sections 129, in which a dopant concentration is significantly higher than a dopant concentration of main sections 121 of the body regions 120 outside the contact sections 129.

The semiconductor component 500 comprises gate structures 150 extending into a silicon carbide body 100 from a first surface 101, and contact structures 315 extending into the silicon carbide body 100 from the first surface 101, wherein the gate structures 150 and the contact structures 315 alternate with one another along a first horizontal direction 191 parallel to the first surface 101. Body regions 120 are formed in mesa sections 190 of the silicon carbide body 100 between the gate structures 150 and the contact structures 315, said body regions comprising main sections 121 adjoining the gate structures 150 and, between the main sections 121 and the contact structures 315, contact sections 129 adjoining the contact structures 315. Shielding regions 160 of the conductivity type of the body regions 120 extend at a bottom of the contact structures 315 and are spaced apart from the gate structures 150 along the first horizontal direction 191.

The semiconductor components 500 according to FIGS. 5A to 5D are SiC TMOSFETs (SiC Trench MOSFETs). A first load electrode 310 on the front side of the components is directly connected to the contact structures 315 through openings in an intermediate dielectric layer 210 and forms the source terminal S of the SiC TMOSFET or is electrically connected to such a source terminal S. A load electrode 320 bearing on the rear side of the SiC TMOSFET on the second surface 102 and directly adjoining the contact section 139 forms the drain terminal D or is electrically connected to the drain terminal D with low impedance. The gate structures 150 have perpendicular sidewalls parallel to principal lattice planes in the SiC crystal of the silicon carbide body 100.

The SiC TMOSFET in FIG. 5A comprises shielding regions 160 directly adjoining the body regions 120. The body regions 120 comprise highly doped contact sections 129 along the contact structures 315. The <0001> crystal direction is tilted relative to the cross-sectional plane in a plane perpendicular to the cross-sectional plane by an angular deviation between 2° and 12°, for example by approximately 4°. The <11-20> crystal direction is parallel to the first surface 101 and parallel to the cross-sectional plane. The <1-100> crystal direction is tilted in the plane perpendicular to the cross-sectional plane by 90° with respect to the <0001> crystal direction. Vertical side faces of the mesa sections 190 are (11-20)- and (−1-120) lattice planes having approximately the same charge carrier mobility.

In the SiC TMOSFET in FIG. 5B, the <0001> crystal direction is tilted in a plane perpendicular to the cross-sectional plane by 4° with respect to the cross-sectional plane. The <11-20> crystal direction is tilted in the plane perpendicular to the cross-sectional plane by 90° relative to the <0001> crystal direction. The <1-100> crystal direction is parallel to the first surface 101 and to the cross-sectional plane. Vertical side faces of the mesa sections 190 lie in the (1-100) and (−1100) lattice planes having high charge carrier mobility. In comparison with the SiC TMOSFET in FIG. 5A, the shielding regions 160 reach out laterally further in the direction of the adjacent gate structures 150.

In FIG. 5C, the shielding regions 160 are spaced apart from the body regions 120, such that Schottky contacts SC are formed along sidewalls of the contact structures 315 between the body regions 120 and the shielding regions 160.

The SiC TMOSFET in FIG. 5D comprises contact structures 315 that extend into the silicon carbide body 100 more deeply than the gate structures 150, such that Schottky contacts SC formed between the body regions 120 and the shielding regions 160 have a larger area per transistor cell TC.

Figure 6:
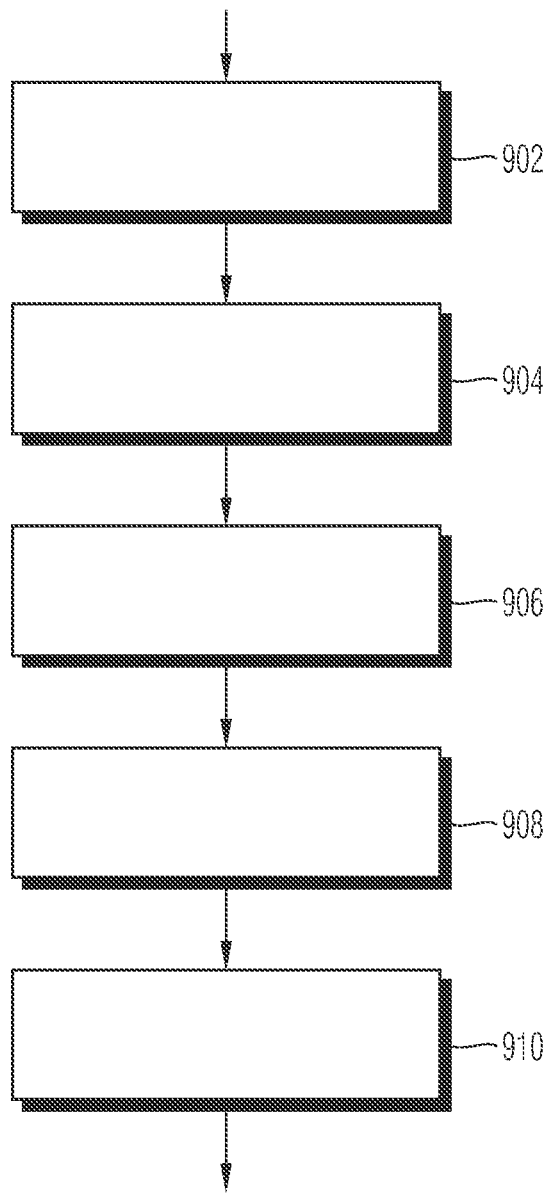
FIG. 6 is a simplified flow diagram of a method for producing semiconductor components comprising trench gates and trench contacts in accordance with one embodiment.

FIG. 6 relates to a method by which for example semiconductor components 500 as described above are producible. A silicon carbide substrate is formed, in which a body layer is formed on a section of a main layer and a source layer is formed on a section of the body layer, wherein a conductivity type of the body layer is opposite to a conductivity type of the source layer and of a drift layer formed in the main layer (902). Gate trenches and contact trenches are introduced through the source layer and the body layer, which trenches alternate along a first horizontal direction parallel to a first main surface of the silicon carbide substrate (904). A gate dielectric is formed in the gate trenches (906). A metal structure is formed, which comprises first sections adjoining the gate dielectric in the gate trenches, and which comprises second sections adjoining body regions formed from sections of the body layer and source regions formed from sections of the source layer (908). Third sections of the metal structure that connect the first sections to the second sections of the metal structure are removed (910).

The simultaneous formation of gate trenches and contact trenches enables a narrow distance between body trenches and contact trenches. Simultaneously forming the metal structure both in the gate trenches and in the contact trenches makes it possible to use metals and/or metal compounds that are customary in semiconductor technology, such as, for example, a metal silicide, titanium, tantalum, titanium nitride, tantalum nitride and tungsten for forming gate electrodes and contact structures.

FIGS. 7A to 7D relate to one embodiment of a production method for SiC semiconductor components in which the dopants for forming shielding regions are introduced through the bottom of contact trenches.

Firstly, a silicon carbide substrate 700 is provided, which can comprise at least one heavily doped substrate section 739 and a layer section 790 formed on the substrate section 739 by epitaxy, for example. The substrate section 739 and a lower partial section of the layer section 790 that adjoins the substrate section 739 form a main layer 730, which comprises at least one weakly doped drift layer 731 besides the substrate section 739. A body layer 720 is formed on a section of the main layer 730 and a source layer 710 is formed on a section of the body layer 720. An exposed surface of the layer section 790 on the front side of the silicon carbide substrate 700 forms a first main surface 701 and an exposed surface of the substrate section 739 on the rear side of the silicon carbide substrate 700 forms a second main surface 702. The silicon carbide substrate 700 can consist of 2H SiC, 4H SiC, 6H SiC, 15R SiC or of a silicon carbide of some other polytype.

Figure 7A:
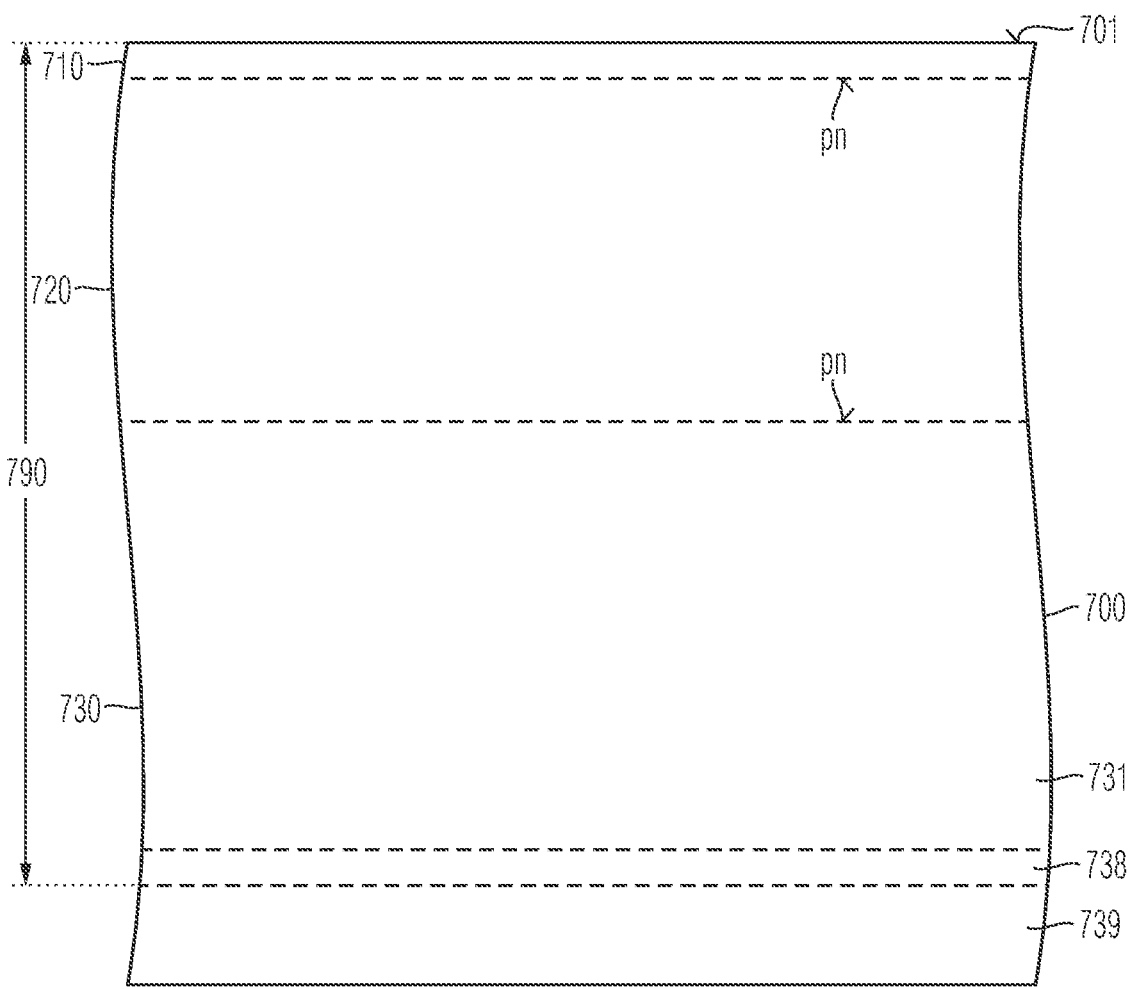
FIG. 7A is a schematic cross section through a section of a silicon carbide substrate for illustrating a method for producing semiconductor components comprising trench gates and trench contacts in accordance with one embodiment including simultaneously forming a metal structure for the trench gates and the trench contacts, after forming a silicon carbide substrate comprising source layer, body layer and drift layer.

FIG. 7A shows that the body layer 720 forms pn junctions with the main layer 730 and with the source layer 710, said pn junctions extending parallel to the first main surface 701. Between the drift layer 731 and the substrate section 739, the main layer 730 can comprise a buffer layer 738 of the conductivity type of the drift layer 731. In accordance with one exemplary embodiment, the body layer 720 is p-doped.

Gate trenches 750 and contact trenches 715 are introduced from the front side, said trenches extending right into the main layer 730. Dopants of the conductivity type of the body layer 720 are introduced selectively through the bottom of the contact trenches 715.

In accordance with FIG. 7B, gate trenches 750 and contact trenches 715 alternate along a first horizontal direction 191. Sections of the silicon carbide substrate 700 between adjacent gate trenches 750 and contact trenches 715 form mesa sections 190, wherein sections of the source layer 710 from FIG. 7A between adjacent gate trenches 750 and contact trenches 715 form body regions 120, source regions 110 and sections of the body layer 720 from FIG. 7A between adjacent gate trenches 750 and contact trenches 715 form body regions 120. The body regions 120 form first pn junctions pn1 with the main layer 730 and second pn junctions pn2 with the source regions 110 in each case in the mesa sections 190.

The dopants introduced through the bottom of the contact trenches 715 form shielding regions 160 exclusively in the region of the contact trenches 715, said shielding regions being spaced apart from adjacent gate trenches 750 and extending into the silicon carbide substrate 700 more deeply than the gate trenches 750. The shielding regions 160 form further pn junctions with the main layer 730, for example with the drift layer 731.

A gate dielectric 159 is formed in the gate trenches 750. By way of example, a silicon oxide is formed by thermal oxidation of areas of the silicon carbide substrate 700 that are exposed on the front side. Alternatively or additionally, it is possible to deposit one or more dielectric layers covering the first main surface 701, the bottoms of the gate trenches 750 and of the contact trenches 715 and also the sidewalls of the gate trenches 750 and of the contact trenches 715 with uniform layer thickness. An etching mask can then be formed, which selectively fills or covers the gate trenches 750, such that sections of the grown or deposited dielectric layers in the region of the contact trenches 715 can be removed in a masked etching process.

Figure 7C:
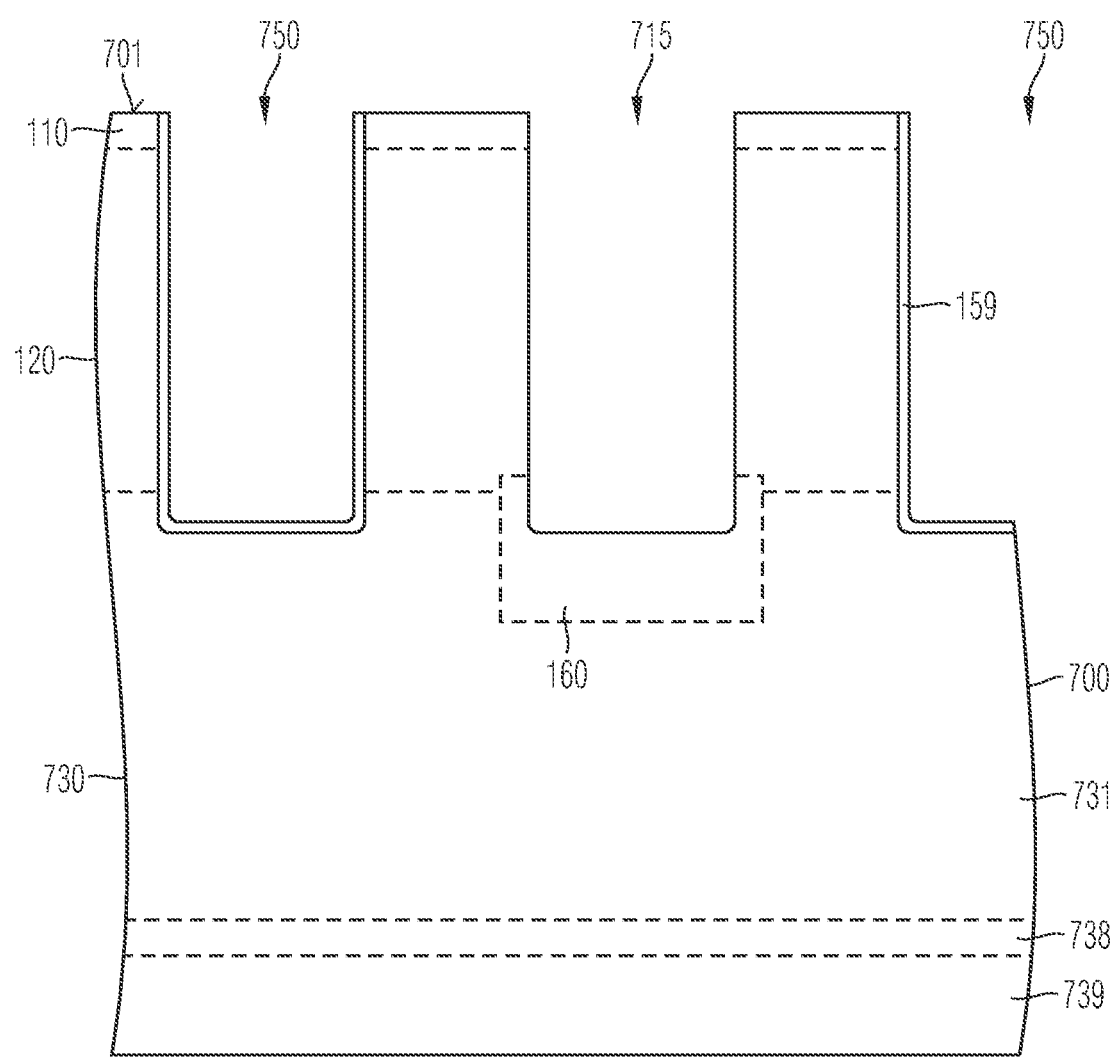
FIG. 7C is a schematic cross section of the section of the silicon carbide substrate from FIG. 7B after forming a gate dielectric in the gate trenches.

FIG. 7C shows the gate dielectric 159 in the gate trenches 750 and also contact trenches 715 without a gate dielectric.

A metal structure 170 is applied in two or more partial processes, wherein each partial process forms a partial layer or a section of a partial layer of the metal structure. By way of example, firstly a thin first partial layer 173 is deposited, which firstly permits only a small number of surface states along the gate dielectric 159 and/or forms a low-impedance and reliable contact with silicon carbide and/or forms suitable Schottky contacts, e.g. a titanium nitride layer.

In a second step, a second partial layer can be applied, which completely fills the remaining interior of the gate trenches 750 and of the contact trenches 715 from FIG. 7C. In this case, first sections 171 of the metal structure 170 fill the gate trenches 750 and second sections of the metal structure 170 fill the contact trenches 715. In a further step, third sections of the metal structure 170 that are formed above the first main surface 701 and that connect the first sections 171 to the second sections 172 are removed.

Figure 7D:
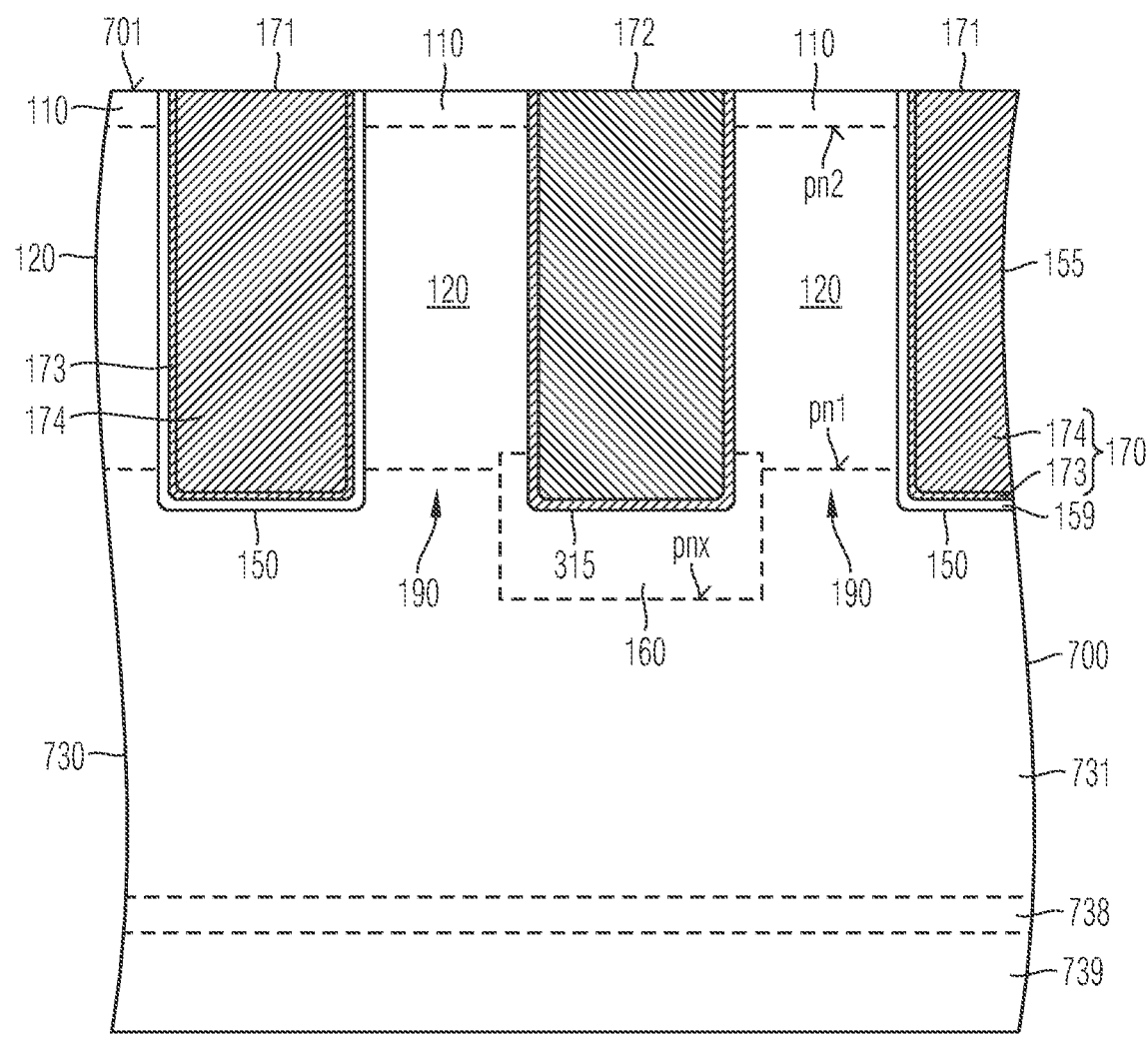
FIG. 7D is a schematic cross section of the section of the silicon carbide substrate from FIG. 7C after forming a metal structure comprising first sections in the gate trenches and second sections in the contact trenches.

FIG. 7D shows a structure that resulted from the method described, wherein the shielding regions 160 are formed in a self-aligned manner with respect to contact structures 315 formed by the second sections 172 of the metal structure 170. The first sections 171 of the metal structure 170 together with the gate dielectric 159 form gate structures 150.

FIGS. 8A to 8L relate to one embodiment of a production method for SiC semiconductor components in which the dopants for forming shielding regions are introduced before contact trenches are formed.

Figure 8A:
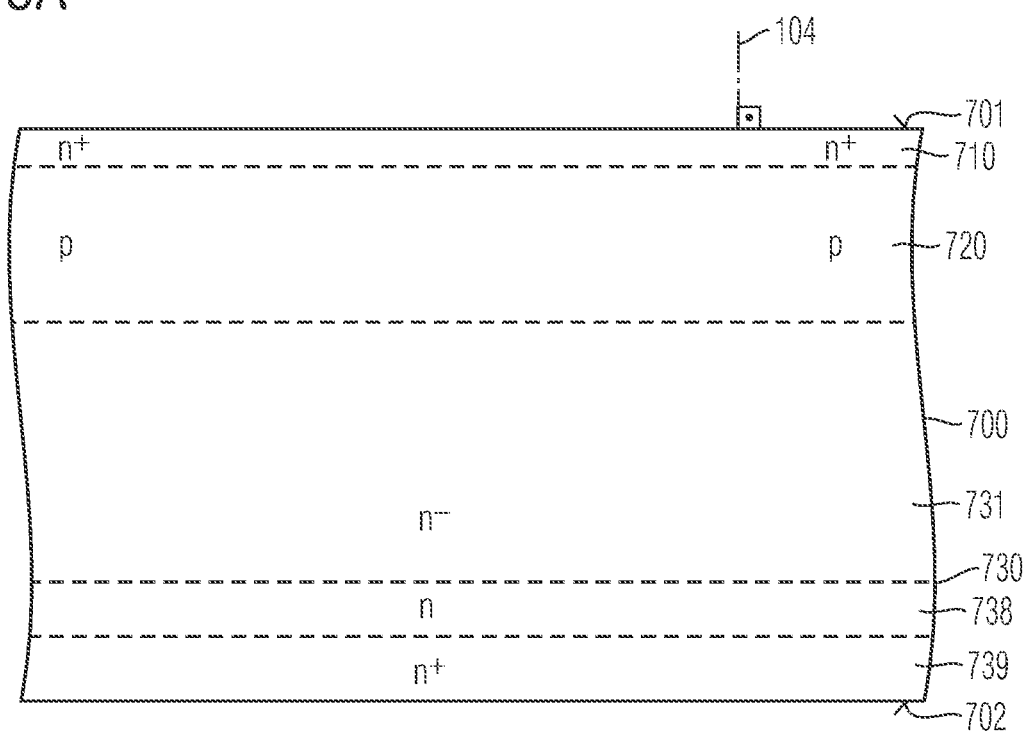
FIG. 8A is a schematic cross section through a section of a silicon carbide substrate for illustrating a further method for producing semiconductor components comprising trench gates and trench contacts in accordance with a further embodiment including simultaneously forming a metal structure for trench gates and trench contacts, after forming a silicon carbide substrate comprising source layer, body layer and drift layer.

FIG. 8A shows a silicon carbide substrate 700 comprising an n+ doped substrate section 739 of the 4H polytype. In accordance with one embodiment, the <0001> crystal direction is tilted in a plane perpendicular to the cross-sectional plane by an angular deviation between 2° and 12°, for example by approximately 4°, with respect to the normal 104, and the <11-20> crystal direction is in the cross-sectional plane and parallel to the first main surface 701, such that subsequently it is possible to form trenches having vertical side faces along (11-10) lattice planes and it is thus possible to utilize the good channel properties in said lattice planes. In accordance with another embodiment, the <0001> crystal direction is tilted in the plane perpendicular to the cross-sectional plane by the angular deviation with respect to the normal 104, and the <1-1000> crystal direction is parallel to the cross-sectional plane and the first main surface 701, such that in the further procedure it is possible to form trenches having vertical side faces along the (1-100) lattice planes with comparatively good channel properties.

An n-doped buffer layer 738 and an n-doped drift layer 731 can be formed successively on the substrate section 739 by epitaxy. A p-doped body layer 720 is formed on the drift layer 731 and an n++-doped source layer 710 is formed on the body layer 720. By way of example, the body layer 720 and the source layer 710 can be formed by implantation of dopants into sections of an epitaxial layer that was grown on the buffer layer 738. A remaining section of the epitaxial layer between the body layer 720 and the buffer layer 738 then forms the drift layer 731. The implantation of dopants for forming the body layer 720 and the source layer 710, respectively, can be carried out in a masked manner, such that dopants fail to be implanted into edge termination regions of component regions defined in the silicon carbide substrate 700.

FIG. 8A shows the silicon carbide substrate 700 comprising a main layer 730 encompassing the substrate section 739, the buffer layer 738 and the drift layer 731, comprising the body layer 720 formed only in active regions of component regions on the main layer 730, and comprising the source layer 710 likewise formed only in active regions.

A hard mask layer consisting of or comprising a silicon oxide layer, for example, is deposited on the first main surface 701 of the silicon carbide substrate 700, said first main surface being defined by the exposed surface of the source layer 710. A first photoresist layer is deposited on the hard mask layer and patterned by means of a lithography method. An etching method transfers the pattern of the developed first photoresist layer into the hard mask layer, wherein a first hard mask 410 having first openings 415 is formed from the hard mask layer. The developed photoresist layer is removed. Dopants of the conductivity type of the body layer 720 are implanted through the first openings 415 of the first hard mask 410 at different implantation energies.

Figure 8B:
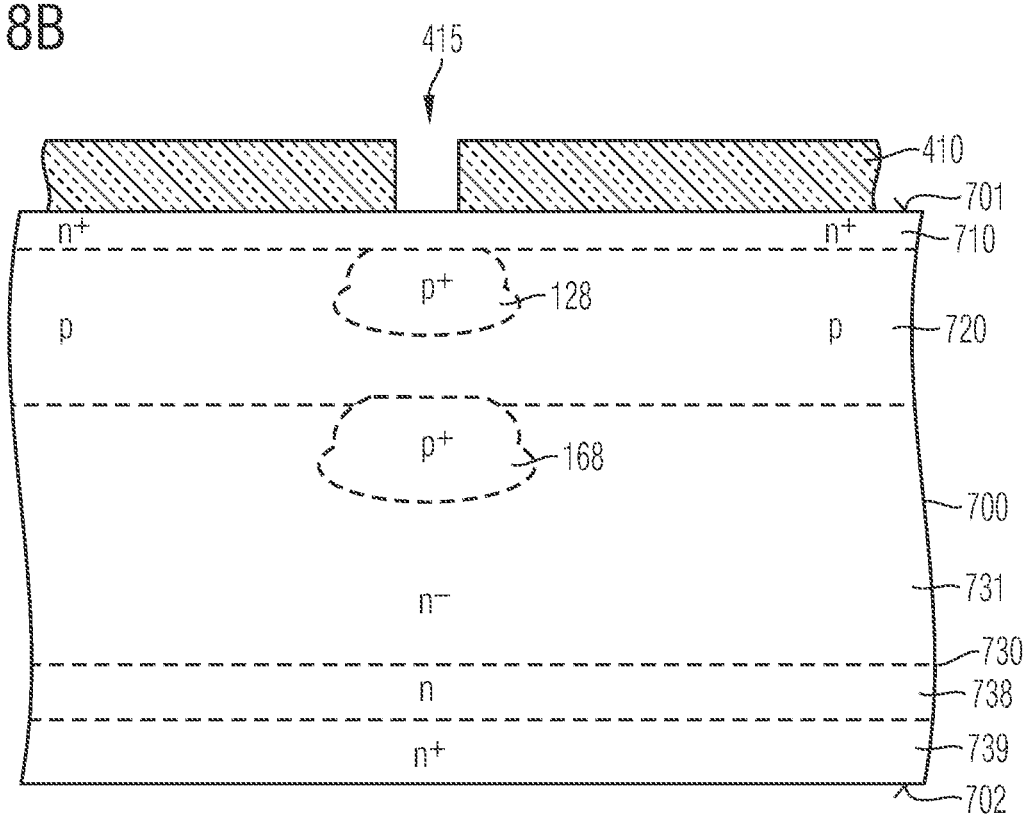
FIG. 8B is a schematic cross section of the substrate section according to FIG. 8A after forming doped regions for highly doped contact sections of body regions and for shielding regions by means of an implantation mask.

FIG. 8B shows the first hard mask 410 having the first openings 415 that is formed from the hard mask layer. In the vertical projection of the first openings 415, the implanted dopants form first doped regions 128 and second doped regions 168, which can be vertically separated from one another. Each of the first and of the second doped regions 128, 168 can result from the implantation with a plurality of different implantation energies. The first doped region 128 is formed substantially within the body layer 720. The second doped region 168 is formed predominantly in the main layer 730 below the body layer 720. A lateral width of the first and second doped regions 128, 168 is greater than a corresponding width of the first openings 415 owing to spreading effects (straggling).

The first hard mask 410 is removed and the implanted dopants can be activated, wherein the atoms of the dopant occupy regular lattice sites in the crystal lattice.

Figure 8C:
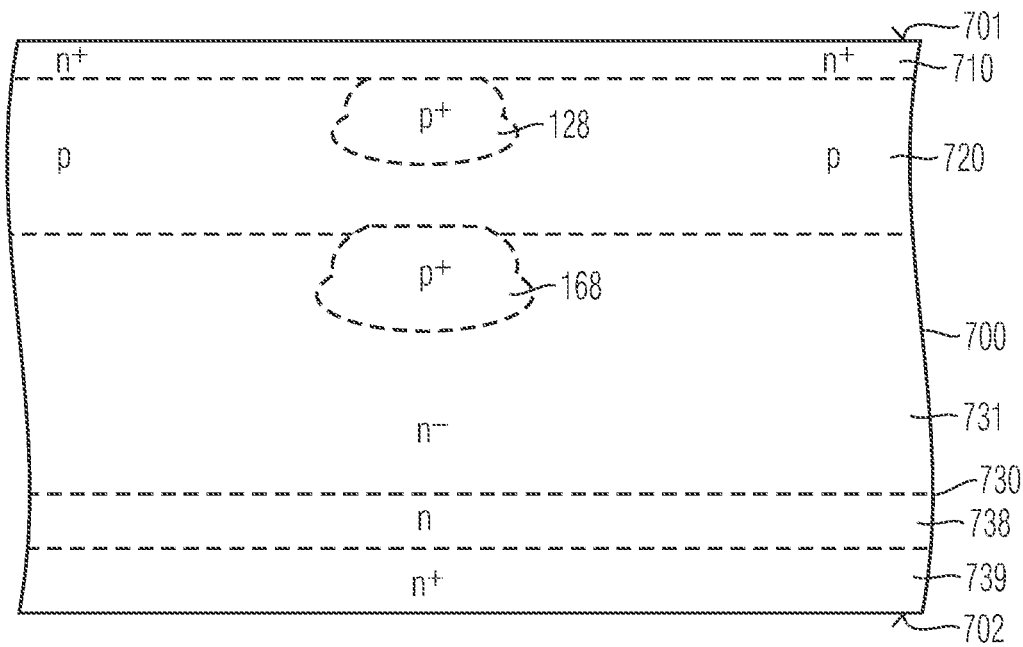
FIG. 8C is a schematic cross section of the substrate section according to FIG. 8B after removing the implantation mask.

FIG. 8C shows the first and second doped regions 128, 168 with the activated dopants.

A second hard mask layer can be deposited and patterned by means of a second developed photoresist layer 422, wherein a trench etching mask 420 having first mask openings 425 and second mask openings 426 results from the second hard mask layer.

Figure 8D:
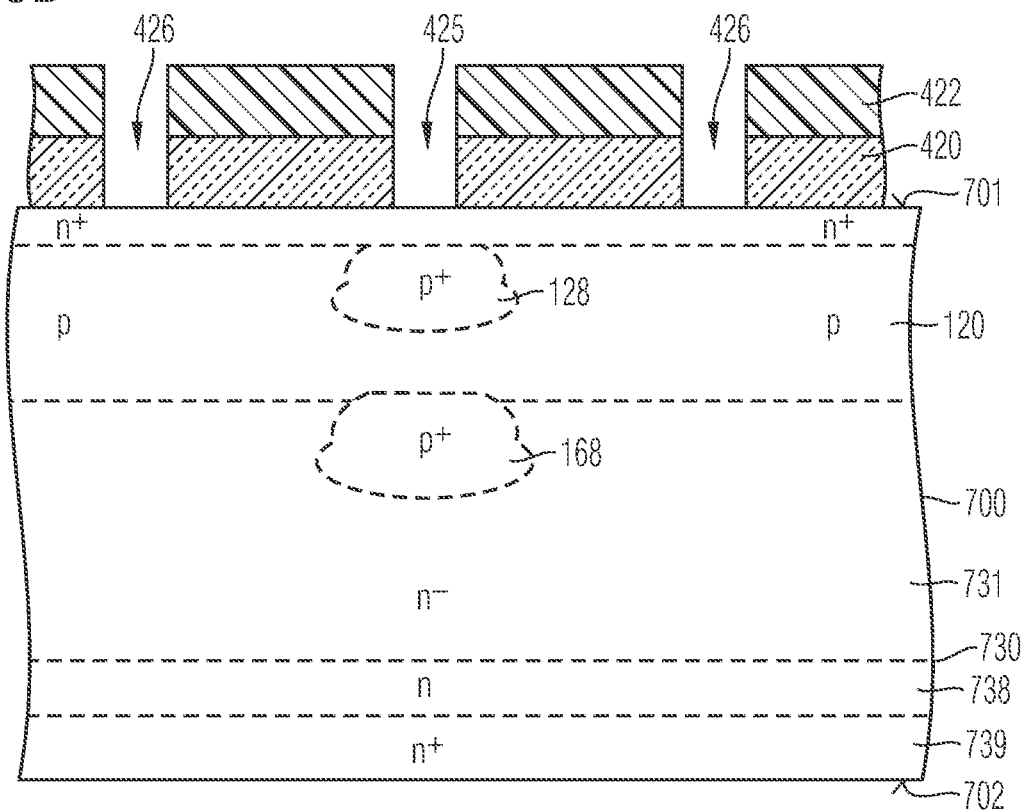
FIG. 8D is a schematic cross section of the substrate section according to FIG. 8C after forming a trench etching mask.

FIG. 8D shows the second developed photoresist layer 422 and the trench etching mask 420 having the first and second mask openings 425, 426. The first mask openings 425 are in the vertical projection of the first and second doped regions 128, 168. The second mask openings 426 are formed in each case centrally between two adjacent first mask openings 425. The developed second photoresist layer 422 can be removed and the pattern of the trench etching mask 420 can be transferred into the silicon carbide substrate 700, wherein trenches having approximately vertical side faces are etched in the silicon carbide substrate 700. In accordance with another embodiment, two different trench etching masks can be produced successively, such that contact trenches 715 and gate trenches 750 can subsequently be formed independently of one another and with different depths. In accordance with another embodiment, contact trenches 715 and gate trenches 750 are firstly etched jointly using the trench etching mask 420 and the contact trenches 715 are deepened selectively with respect to the gate trenches 750 in a further step.

Figure 8E:
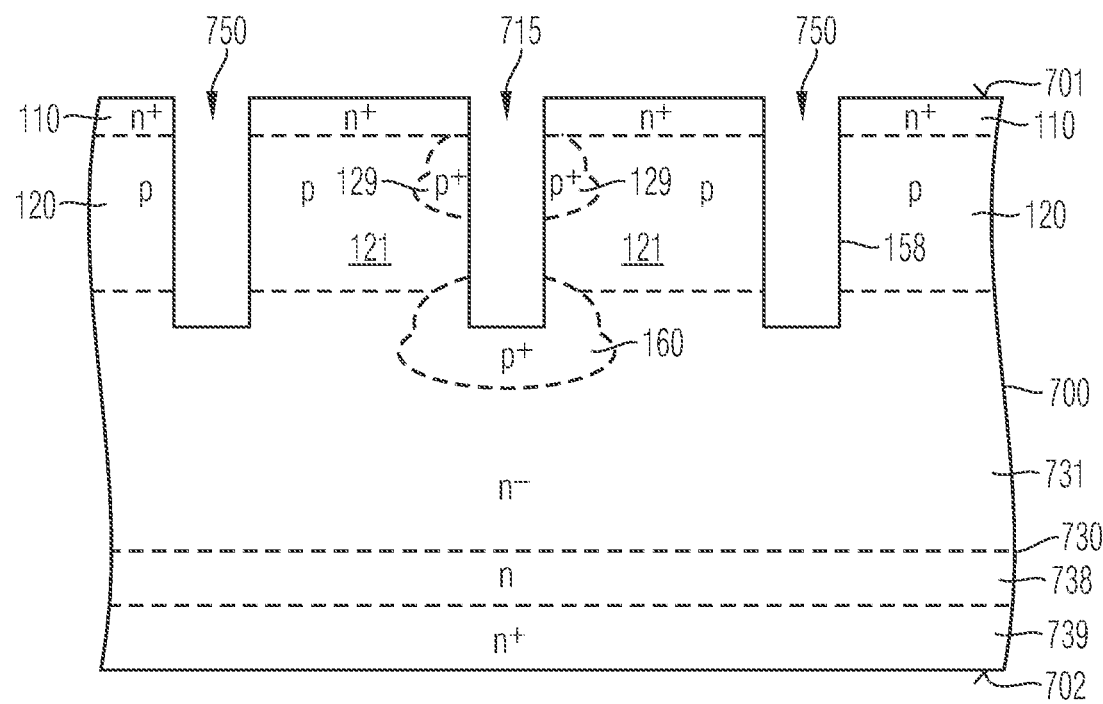
FIG. 8E is a schematic cross section of the substrate section according to FIG. 8D after forming gate trenches and contact trenches.

FIG. 8E shows the contact trenches 715 that resulted from the etching, said contact trenches extending right into the second doped regions 168 from FIG. 8D and separating the first doped regions 128 into contact sections 129 separated from one another on both sides of the respective contact trench 715. The second doped regions 168 from FIG. 8D form shielding regions 160. The gate trenches 750 are formed in each case at a distance from the shielding regions 160 and between in each case two adjacent contact trenches 715. In accordance with one embodiment, inner edges of the gate trenches 750 and/or contact trenches 715 along the trench bottoms and/or outer edges of the gate trenches 750 and contact trenches 715 at the first main surface 701 can be rounded, for example by means of a heat treatment in a hydrogen-containing environment (H2 anneal).

Sections of the silicon carbide substrate 700 that are exposed on the front side can be oxidized by means of a heat treatment in an oxygen-rich atmosphere.

Figure 8F:
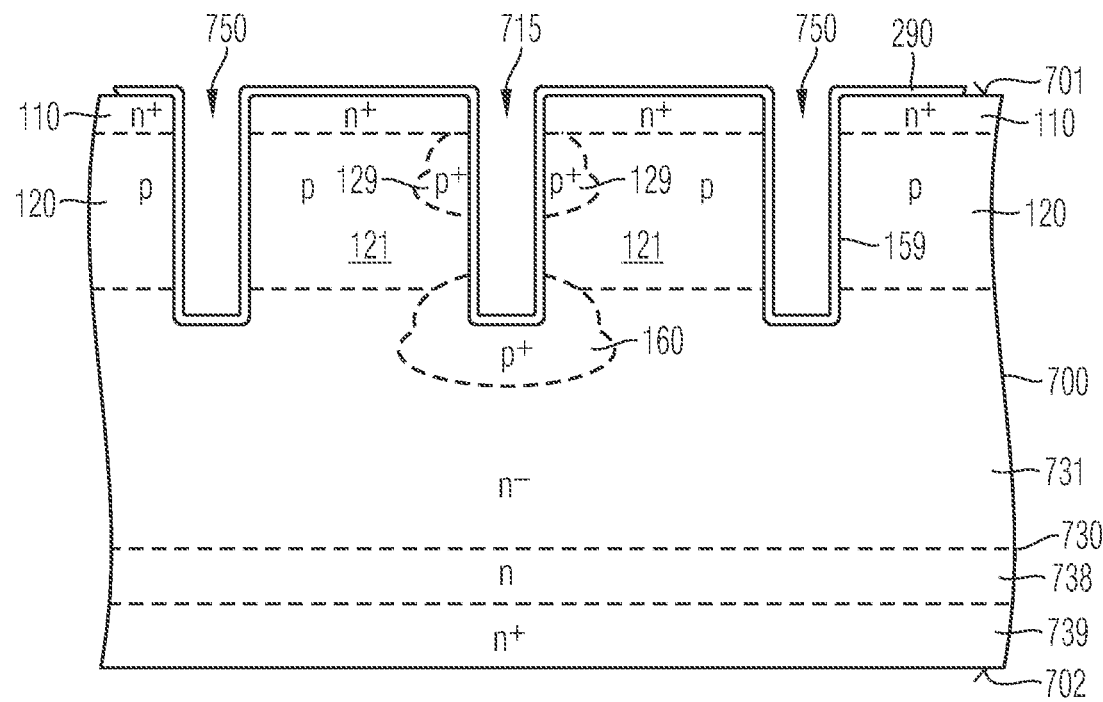
FIG. 8F is a schematic cross section of the substrate section according to FIG. 8E after forming a sacrificial oxide.

FIG. 8F shows the sacrificial oxide layer 290 that arises as a result of the heat treatment, said sacrificial oxide layer covering the silicon carbide substrate 700 on the front side with uniform layer thickness. The sacrificial oxide layer 290 is removed.

Figure 8G:
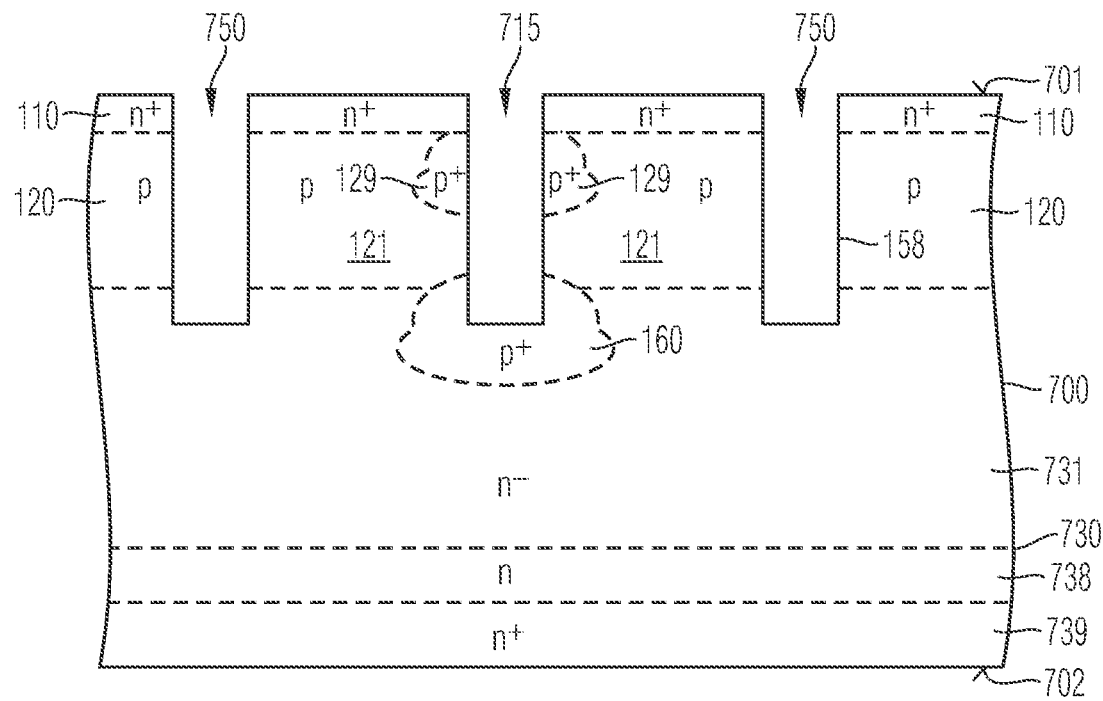
FIG. 8G is a schematic cross section of the substrate section according to FIG. 8F after removing the sacrificial oxide.

FIG. 8G shows the silicon carbide substrate 700 after material-selective removal of the sacrificial oxide layer 290 from FIG. 8F. Crystal defects near the surface are removed by the formation and removal of the sacrificial oxide layer 290.

A gate dielectric layer 158 is formed for example by thermal oxidation of the silicon carbide substrate 700. In accordance with another embodiment, forming the gate dielectric layer 158 comprises depositing silicon oxide, densifying the deposited silicon oxide at temperatures above 1100° C. and, if appropriate, post-oxidation in a hydrogen-poor environment.

The gate dielectric layer 158 can be subjected to aftertreatment, if appropriate, by means of a further heat treatment in an atmosphere containing nitrogen and oxygen. The aftertreatment at high temperatures and under suitable environmental conditions increases the loading capacity of the gate dielectric layer 158 in subsequent process steps in which the gate dielectric layer 158 may be exposed to aggressive environmental conditions, e.g. a chlorine-containing atmosphere during a metal deposition.

Figure 8H:
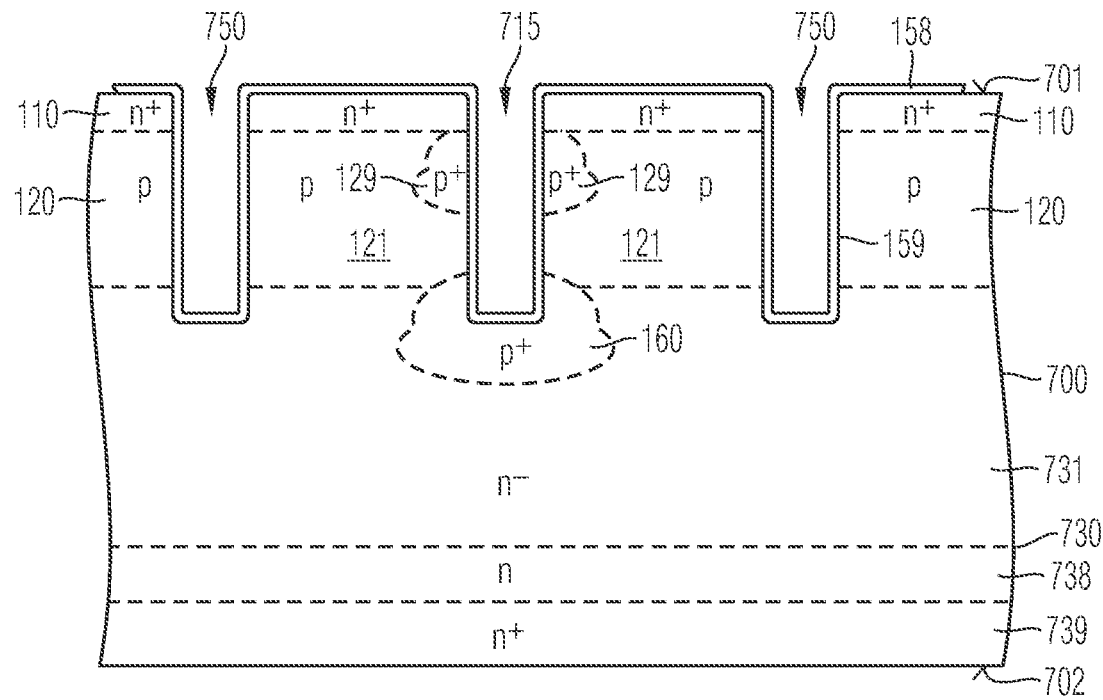
FIG. 8H is a schematic cross section of the substrate section according to FIG. 8G after forming a gate dielectric layer.

FIG. 8H shows the gate dielectric layer 158 covering the silicon carbide substrate 700 on the front side with uniform layer thickness. A third photoresist layer is applied and patterned photolithographically, wherein second openings 435 in the developed third photoresist layer 430 expose the contact trenches 715.

Figure 8I:
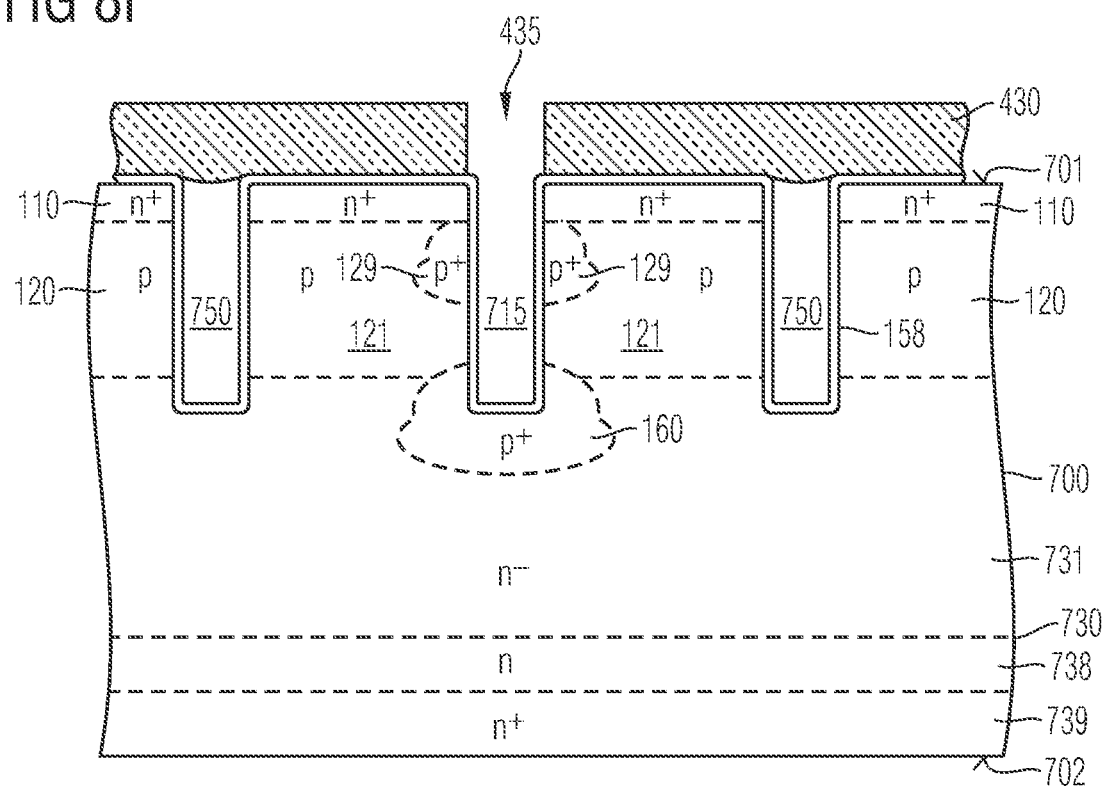
FIG. 8I is a schematic cross section of the substrate section according to FIG. 8H after forming an etching mask.

FIG. 8I shows the third developed photoresist layer 430 filling or at least covering the gate trenches 750. The second openings 435 in the developed third photoresist layer 430 expose sections of the gate dielectric layer 158 in the contact trenches 715. The developed third photoresist layer 430 can cover mesa sections 190 of the silicon carbide substrate 700 between the contact trenches 715, on the one hand, and the gate trenches 750, on the other hand.

Exposed sections of the gate dielectric layer 158 are removed using the developed third photoresist layer 430 as an etching mask. The developed third photoresist layer 430 is then removed.

Figure 8J:
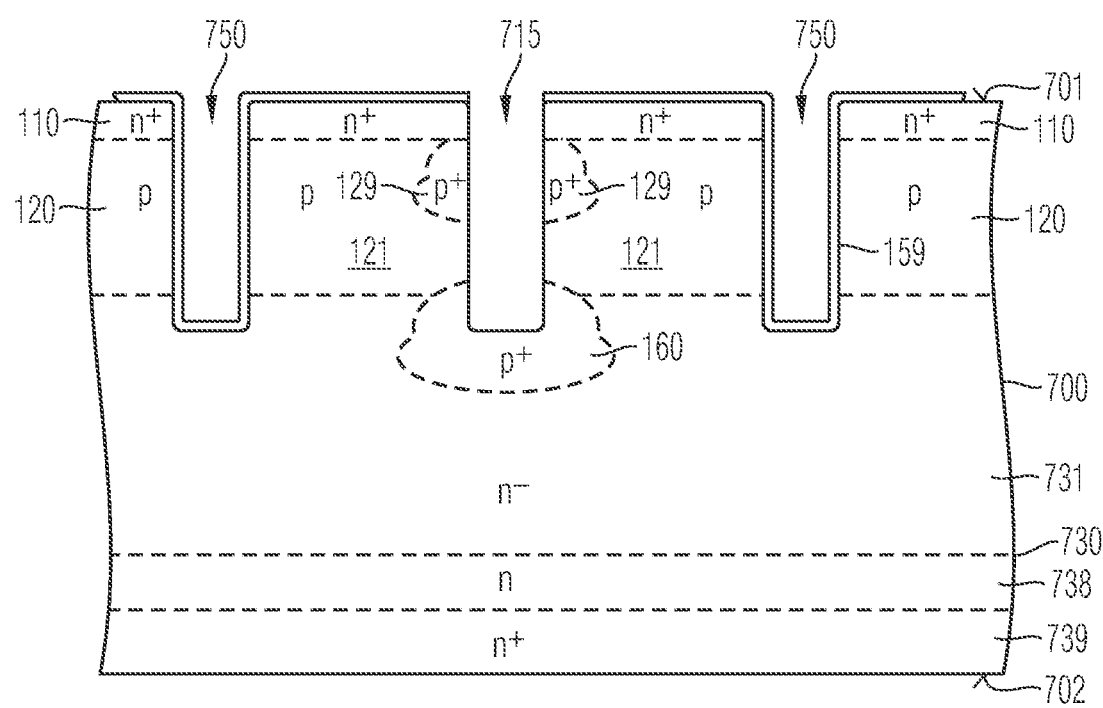
FIG. 8J is a schematic cross section of the substrate section according to FIG. 8I after removing a section of the gate dielectric layer from the contact trenches.

FIG. 8J shows a gate dielectric 159 that resulted from the gate dielectric layer 158 from FIG. 8I, which gate dielectric lines the gate trenches 750 and can cover at least one portion of the mesa sections 190. The source regions 110 and contact sections 129 of the body regions 120 are exposed at the side faces of the contact trenches 715. The shielding region 160 is exposed at the bottom of the contact trenches 715 and, if appropriate, along lower sections of the side faces of the contact trenches 715.

A metal-containing first partial layer 173 composed of metal or a metal compound is formed, for example by atomic layer deposition (ALD) or from a combination of ALD and a heat treatment. In accordance with one embodiment, forming the first partial layer 173 comprises depositing a titanium nitride layer by means of ALD. A second partial layer 174 composed of a metal or a metal compound can be applied, for example by sputtering of tungsten.

Figure 8K:
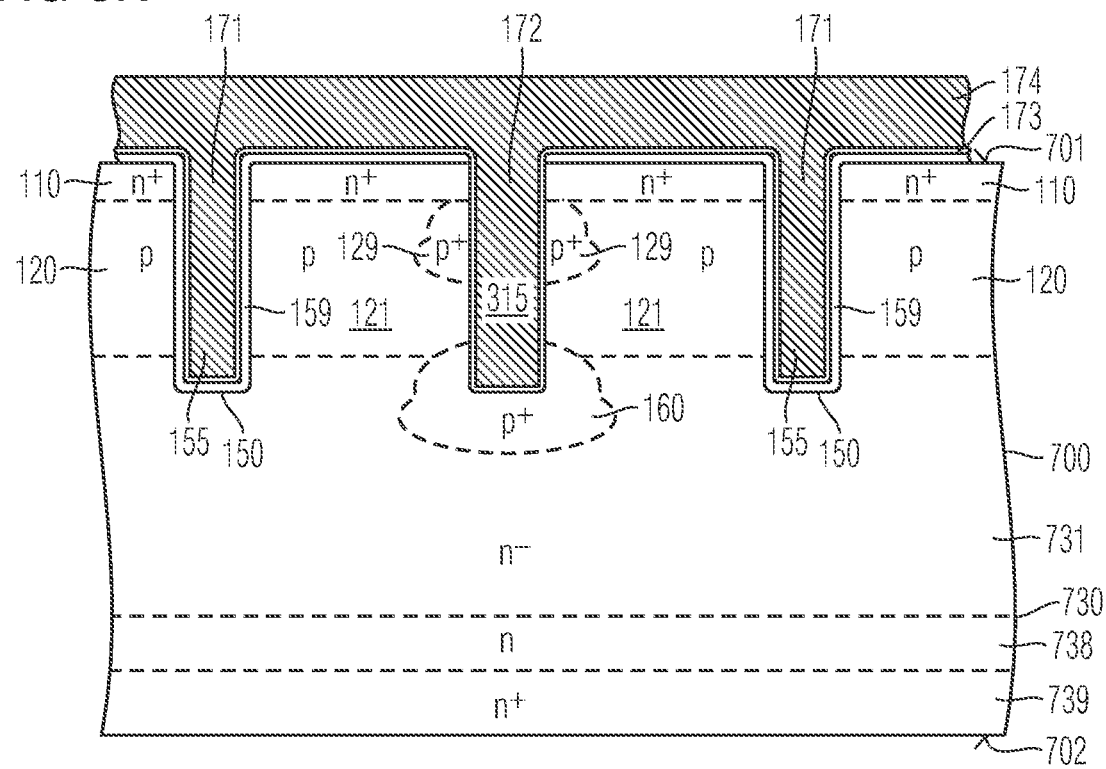
FIG. 8K is a schematic cross section of the substrate section according to FIG. 8J after forming a metal structure comprising first sections in the gate trenches and second sections in the contact trenches.

FIG. 8K shows a metal structure 170 formed from the first partial layer 173 and the second partial layer 174. The first partial layer 173 lines the gate trenches 750 and the contact trenches 715 with high conformity. A layer thickness of the first partial layer 173 can be a plurality of nanometers, for example tens of nanometers. The second partial layer 174 fills the interior of the contact trenches 715 and the interior of the gate trenches 750 from FIG. 8J. The first partial layer 173 can be or comprise for example a metal silicide layer, a titanium layer, a tantalum layer, a titanium nitride layer, a tantalum nitride layer or some other layer containing at least titanium or tantalum.

First sections 171 of the metal structure 170 in the gate trenches 750 from FIG. 8J form gate electrodes 155, wherein the gate electrodes 155 together with the gate dielectric 159 form gate structures 150. Second sections 172 of the metal structure 170 in the contact trenches 715 from FIG. 8J form contact structures 315 with low-impedance junctions with the source regions 110, the contact sections 129 of the body regions 120, and with the shielding regions 160. Third sections 175 of the metal structure 170 above the first main surface 701 connect the first sections 171 to the second sections 172.

The third sections 175 of the metal structure 170 are removed, for example by wet etching, if appropriate in conjunction with chemical-mechanical polishing (CMP), wherein the exposure of sections of the gate dielectric 159 on the mesa sections 190 can serve as a stop signal for the polishing.

Figure 8L:
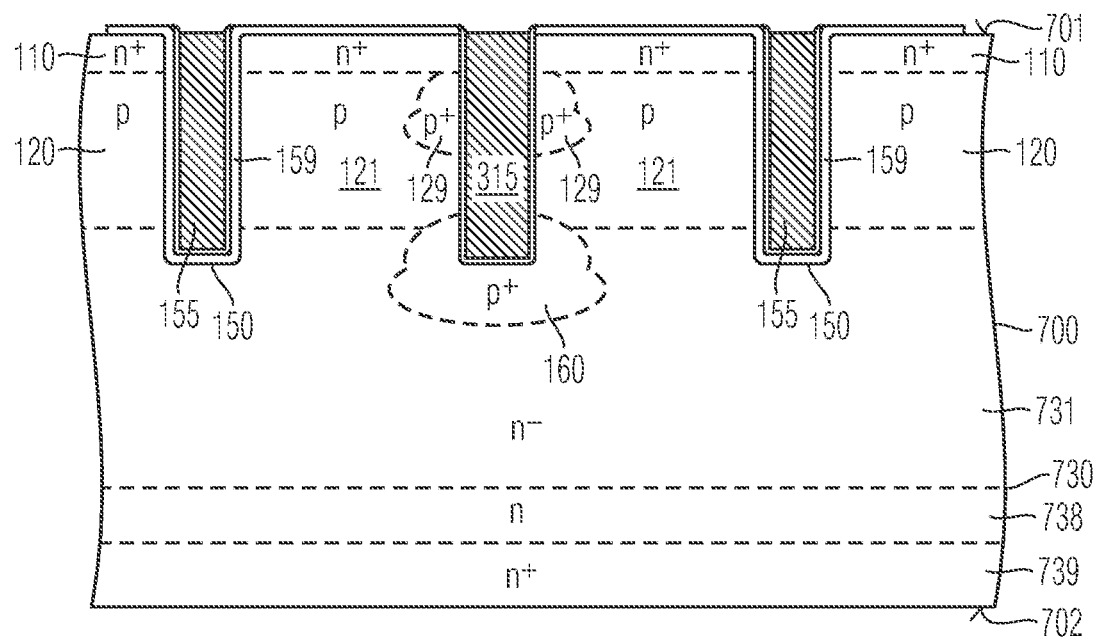
FIG. 8L is a schematic cross section of the substrate section according to FIG. 8K after removing third sections of the metal structure outside the gate trenches and the contact trenches.

FIG. 8L shows the silicon carbide substrate 700 after removing the third sections 175 of the metal structure 170 from FIG. 8K.

FIGS. 9A to 9G relate to the formation of shielding regions 160 by implantation through the bottom of contact trenches 715 before the filling thereof with a metal structure.

Figure 9A:
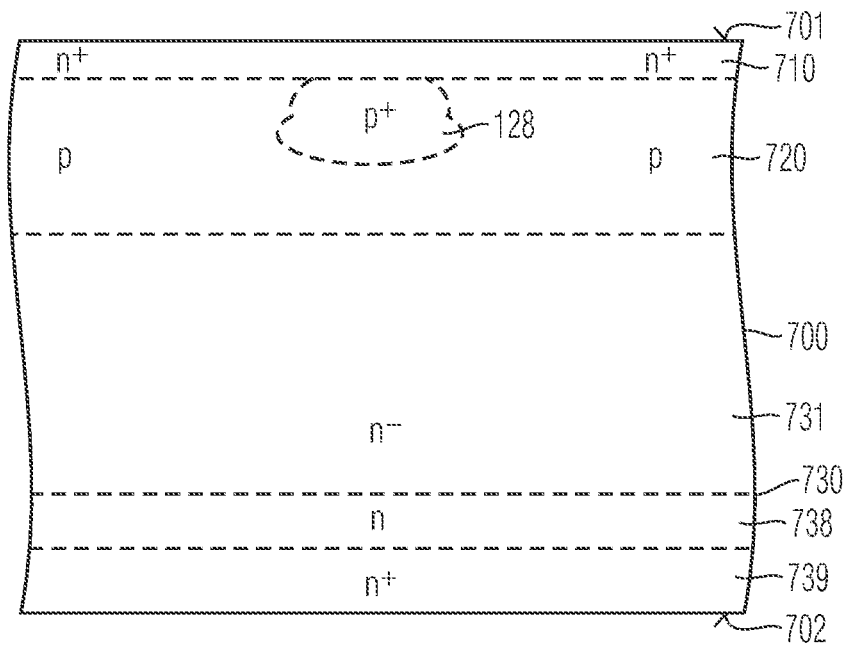
FIG. 9A is a schematic cross section through a section of a silicon carbide substrate in accordance with one embodiment comprising forming shielding regions by implantation through trench bottoms after forming doped regions for contact sections of body regions.

FIG. 9A shows a silicon carbide substrate 700 after the implantation of dopants for forming the first doped regions 128, as described with reference to FIGS. 8A and 8C.

Figure 9B:
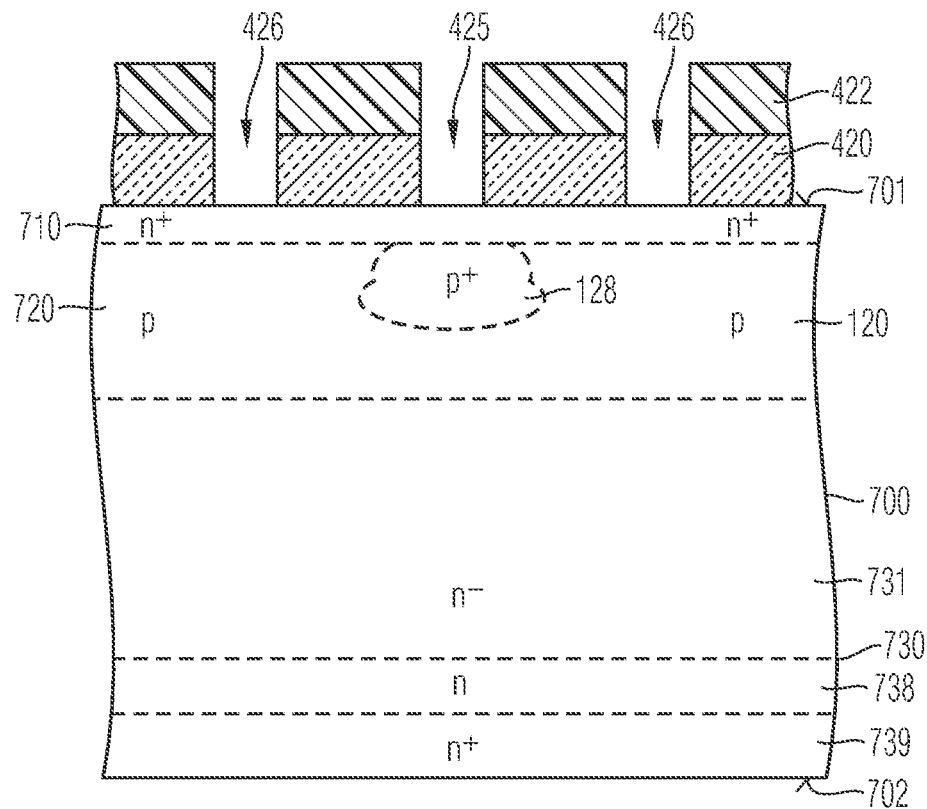
FIG. 9B is a schematic cross section of the substrate section according to FIG. 9A after forming a trench etching mask.

In accordance with FIG. 9B, as described with reference to FIG. 8D, a trench etching mask 420 having first mask openings 425 and second mask openings 426 is formed on the first main surface 701, wherein the first mask openings 425 are formed in the vertical projection of the first doped regions 128 and the second mask openings 426 are formed in each case centrally between two adjacent first mask openings 425.

The pattern of the trench etching mask 420 is transferred into the silicon carbide substrate 700, wherein contact trenches 715 and gate trenches 750 are formed in the silicon carbide substrate 700. Edges at the bottom and at the opening of the contact trenches 715 and of the gate trenches 750 can be rounded, for example by means of a heat treatment in an atmosphere in which silicon carbide neither oxidizes nor forms a nitride layer, wherein the heat treatment regroups the atoms of the silicon carbide crystal in a suitable manner.

Figure 9C:
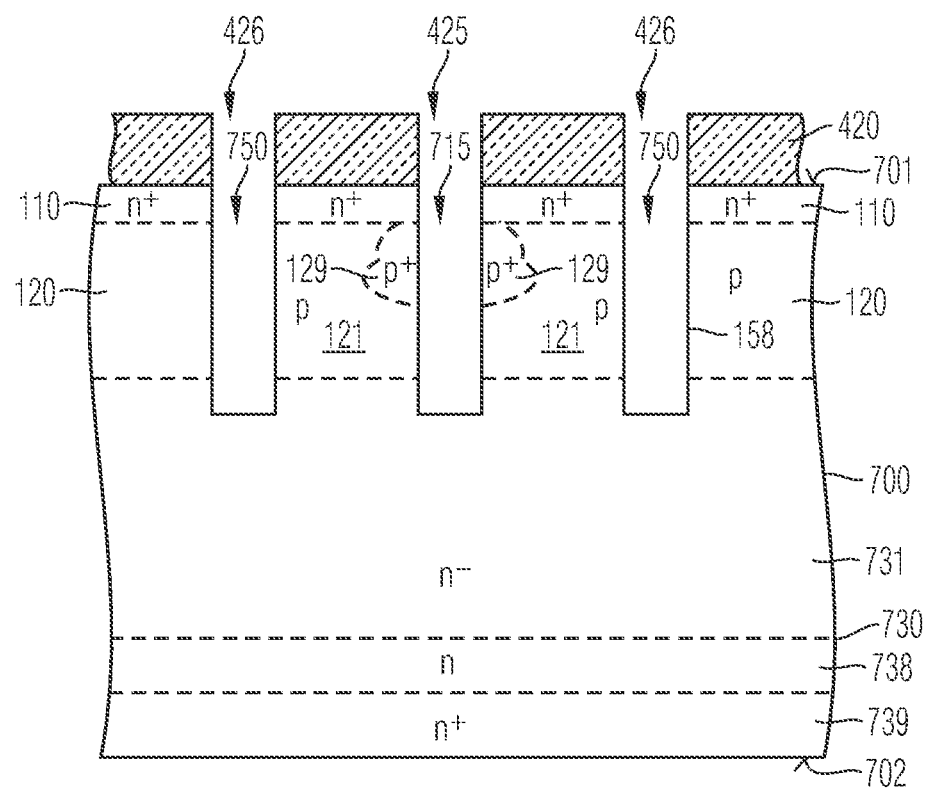
FIG. 9C is a schematic cross section of the substrate section according to FIG. 9B after forming gate trenches and contact trenches.

FIG. 9C shows the contact trenches 715 that resulted from the etching, said contact trenches extending right into the drift layer 731 and separating the first doped regions 128 into contact sections 129 separated from one another on both sides of the respective contact trench 715. Residual sections of the body layer 720 in mesa sections of the silicon carbide substrate 700 between the contact trenches 715 and the gate trenches 750 form body regions 120 and residual sections of the source layer 710 in the mesa sections form source regions 110.

Exposed sections of the silicon carbide substrate 700 in the contact trenches 715 and in the gate trenches 750 can be oxidized by means of a heat treatment in an oxygen-rich atmosphere.

Figure 9D:
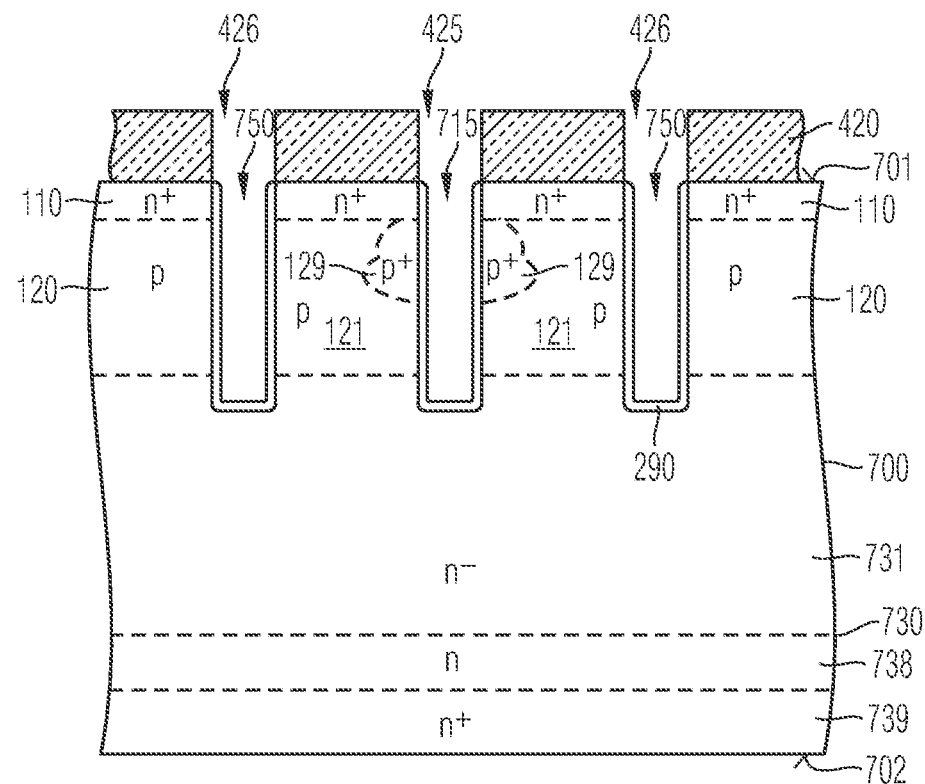
FIG. 9D is a schematic cross section of the substrate section according to FIG. 9C after forming a sacrificial oxide.

As evident from FIG. 9D, a sacrificial oxide layer 290 produced by the heat treatment covers the inner surfaces of the contact trenches 715 and of the gate trenches 750 with approximately uniform layer thickness. A further mask layer is deposited and patterned photolithographically. Dopants of the conductivity type of the body regions 120 are introduced into the silicon carbide substrate 700 through the bottom of the contact trenches 715, for example by means of an implantation process comprising implantations of at least two different energy levels.

Figure 9E:
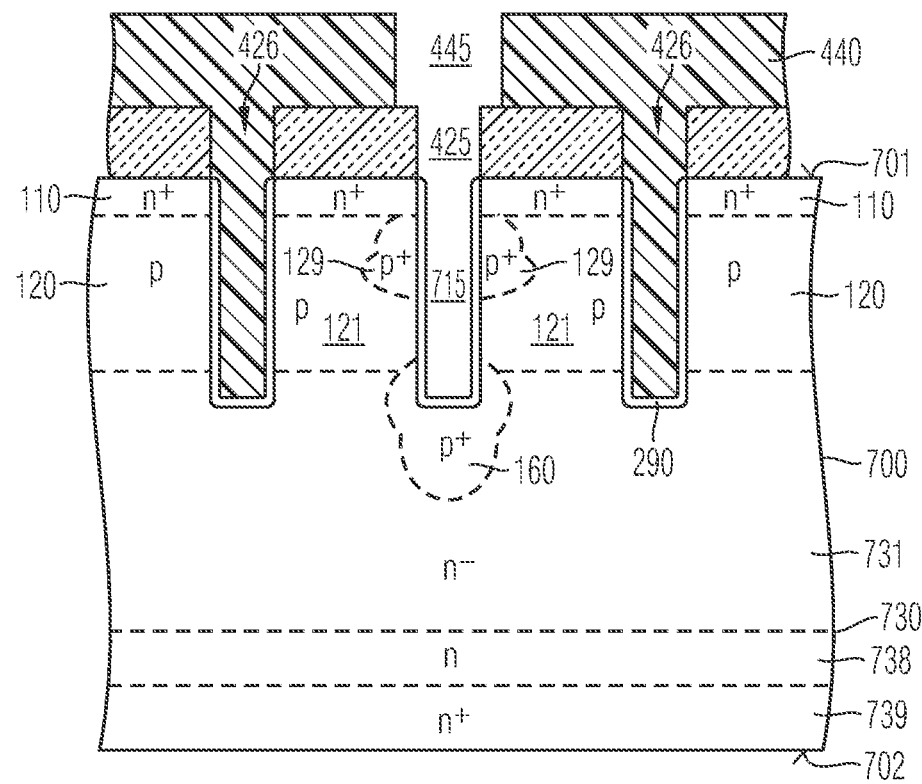
FIG. 9E is a schematic cross section of the substrate section according to FIG. 9D after forming doped regions for shielding regions by means of an implantation mask.

In accordance with FIG. 9E, mask openings 445 of an implantation mask 440 that resulted from the further mask layer expose the first mask openings 425 of the trench etching mask 420 and fill or cover the second mask openings 426. Below the contact trenches 715, the dopants introduced through the trench bottom form shielding regions 160 that are spaced apart from adjacent gate trenches 750 and extend into the silicon carbide substrate 700 more deeply than the gate trenches 750.

By comparison with a formation of the shielding regions 160 by means of an implantation through the first main surface 701, the required implantation energy is reduced by a magnitude corresponding to the vertical extent of the contact trenches 715. Thus, for shielding regions 160 with a comparable vertical extent, the lateral spreading of the dopant and thus the achievable minimum distance between gate trenches 750 and contact trenches 715 are reduced. The energy budget initially saved can also be utilized in part for deeper drive-in of the shielding region 760 into the drift layer 731.

The implantation mask 440, the trench etching mask 420 and the sacrificial oxide layer 290 are removed, wherein crystal defects near the surface are also removed by the formation and removal of the sacrificial oxide layer 290. A gate dielectric layer 158 is formed.

Figure 9F:
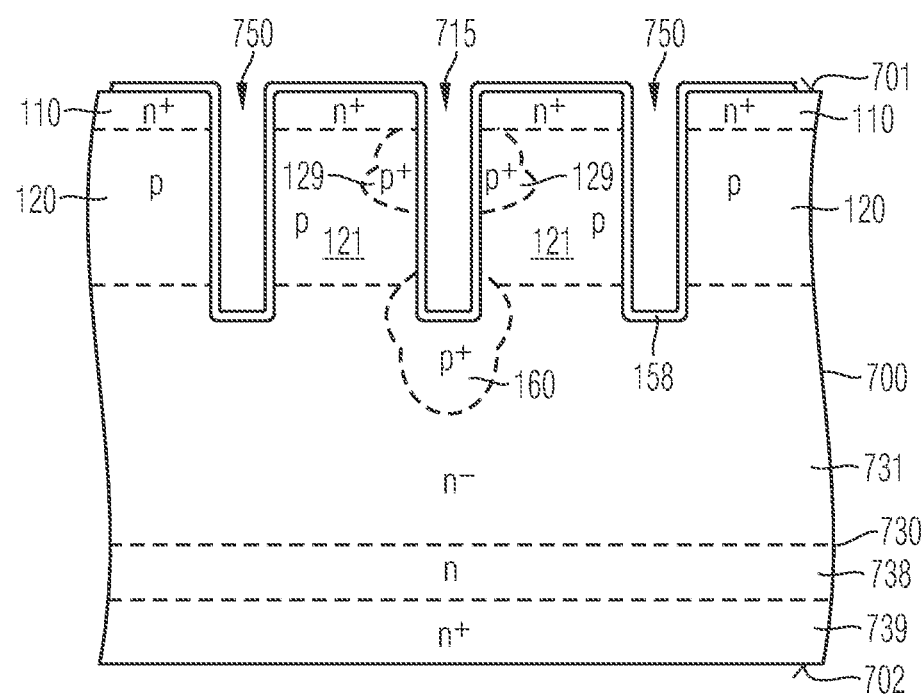
FIG. 9F is a schematic cross section of the substrate section according to FIG. 9E after forming a gate dielectric layer.

FIG. 9F shows the gate dielectric layer 158 covering the silicon carbide substrate 700 on the front side with uniform layer thickness. A third photoresist layer is applied and patterned photolithographically, wherein openings 435 in the developed third photoresist layer 430 expose the contact trenches 715. The developed third photoresist layer 430 can cover mesa sections 190 of the silicon carbide substrate 700 between the contact trenches 715, on the one hand, and the gate trenches 750, on the other hand. Exposed sections of the gate dielectric layer 158 are removed using the developed third photoresist layer 430 as an etching mask.

Figure 9G:
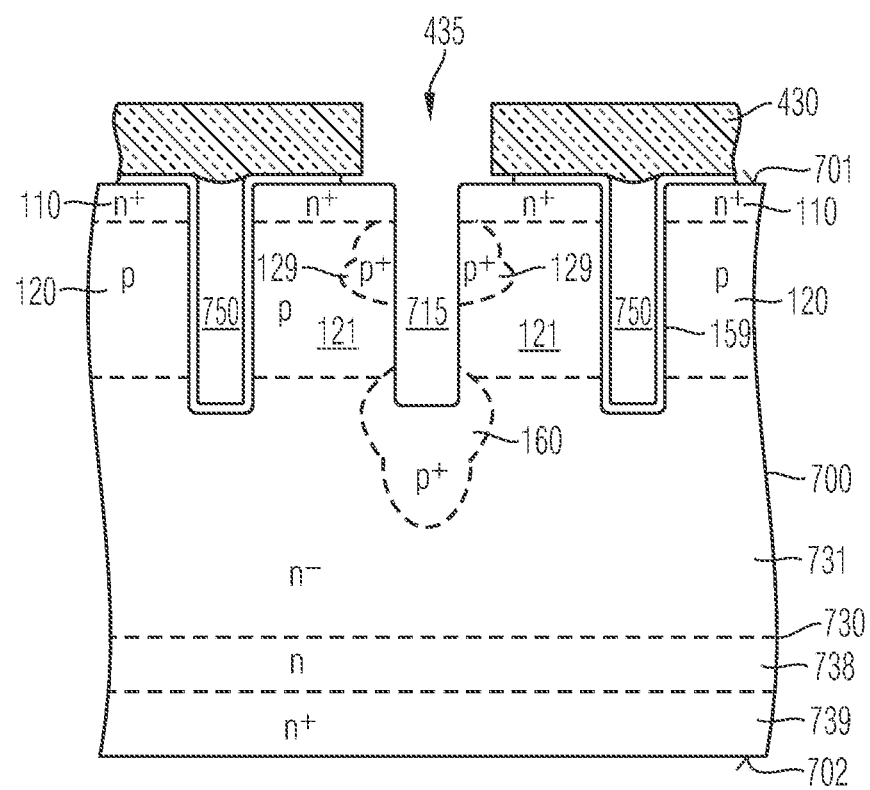
FIG. 9G is a schematic cross section of the substrate section according to FIG. 9F after removing a section of the gate dielectric layer from the contact trenches.

FIG. 9G shows the third developed photoresist layer 430 filling or at least covering the gate trenches 750. The developed third photoresist layer 430 can be partly undercut during the etching of the gate dielectric layer 158. The processing can be continued by forming metal structures in the contact trenches 715 and the gate trenches 750 as described above.

FIG. 10 schematically shows the dopant distribution of a shielding region 160 that results for example from the method described with reference to FIGS. 9A to 9G, wherein the implantation of the dopant comprises at least two partial implantations at different acceleration energies.

The shielding region 160 comprises a first partial region 161 having a net dopant concentration p1 that is higher than a net dopant concentration p2 in a second partial region 162, which for its part is higher than a net dopant concentration p3 in a third partial region 163, which is in turn higher than a net dopant concentration p4 in a fourth partial region 164. The distance v4 between a deepest dopant maximum in the shielding regions 160 and the first surface 101 is significantly greater than the vertical extent v1 of the gate structures 150; by way of example, v3 is at least 150% of v1. A lateral extent w5 of the shielding region 160 beyond the sidewall of the contact structure 315 is a maximum of 60% of the mesa width w3.

Although the present description and the figures contain particular, specific embodiments, it goes without saying for the person skilled in the art in the relevant technical field that there are a large number of alternative and/or equivalent embodiments which can be chosen instead of the specific embodiments, without departing from the scope of the present invention. It is expressly intended that the present application shall encompass any kind of reworking and variant of the specific embodiments. Therefore, it is equally intended that the limits of the present invention shall be found only in the claims and the equivalents thereof.

What is claimed is:

1. A semiconductor component, comprising:
   gate structures extending into a silicon carbide body from a first surface, a width of the gate structures along a first horizontal direction parallel to the first surface being less than a vertical extent of the gate structures perpendicular to the first surface;
   contact structures extending into the silicon carbide body from the first surface, the gate structures and the contact structures alternating along the first horizontal direction;
   shielding regions which, in the silicon carbide body, adjoin a bottom of the contact structures and are spaced apart from the gate structures along the first horizontal direction; and
   source regions between the first surface and body regions, wherein the body regions form pn junctions with the source regions,
   wherein the body regions comprise main sections adjoining the gate structures and; between the main sections and the contact structures, contact sections adjoining the contact structures and having a higher dopant concentration than the main sections,
   wherein the contact sections of the body regions are buried in the silicon carbide body below the source regions such that the source regions separate the contact sections from the first surface,
   wherein both the contact sections of the body regions and the source regions contact a sidewall of the contact structure,
   wherein the gate structures and/or the contact structures are coplanar with the first surface of the silicon carbide body.

2. The semiconductor component of claim 1, wherein a width of the shielding regions along the first horizontal direction is greater than a width of the contact structures.

3. The semiconductor component of claim 1, wherein mesa sections of the silicon carbide body formed between the gate structures and the contact structures comprise the body regions.

4. The semiconductor component of claim 3, wherein a mesa width of the mesa sections along the first horizontal direction is less than the vertical extent of the gate structures.

5. The semiconductor component of claim 3, wherein sections of the contact structures that adjoin the drift structure form Schottky contacts.

6. The semiconductor component of claim 1, wherein a vertical extent of the contact structures is greater than the vertical extent of the gate structures.

7. The semiconductor component of claim 1, wherein the gate structures comprise a gate dielectric and a gate electrode, and wherein the gate electrode comprises first sections of a metal structure that adjoin the gate dielectric.

8. The semiconductor component of claim 7, wherein the contact structures comprise second sections of the metal structure that adjoin the silicon carbide body.

9. The semiconductor component of claim 7, wherein the metal structure comprises at least a first partial layer and a second partial layer, wherein a first section of the first partial layer in the gate structures adjoins the gate dielectric and a second section of the first partial layer in the contact structures adjoins the silicon carbide body, and wherein the second partial layer bears on the first and second sections of the first partial layer.

10. The semiconductor component of claim 9, wherein the first and second sections of the first partial layer have the same composition.

11. The semiconductor component of claim 1, wherein mutually opposite sidewalls of the gate structures form principal lattice planes.

12. The semiconductor component of claim 1, wherein a distance between a maximum dopant concentration in the shielding regions and the first surface is greater than the vertical extent of the gate structures.

13. The semiconductor component of claim 1, wherein the gate structures and the contact structures are formed in strip-like fashion with longitudinal axes parallel to a second horizontal direction, and wherein the second horizontal direction extends parallel to the first surface and orthogonally to the first horizontal direction.

14. The semiconductor component of claim 1, wherein mutually opposite sidewalls of the gate structures are oriented parallel to lattice planes of the silicon carbide body and vertically with respect to the first surface.

15. A semiconductor component, comprising:
   gate structures extending into a silicon carbide body from a first surface;

contact structures extending into the silicon carbide body from the first surface, the gate structures and the contact structures alternating with one another along a first horizontal direction parallel to the first surface;

body regions in mesa sections of the silicon carbide body between the gate structures and the contact structures;

source regions between the first surface and the body regions;

shielding regions of a conductivity type of the body regions, the shielding regions, in the silicon carbide body, adjoining a bottom of the contact structures and being spaced apart from the gate structures along the first horizontal direction; and a drift structure comprising a drift zone and forming first pn junctions with the body regions and Schottky contacts with the contact structures, wherein the body regions comprise main sections adjoining the gate structures and, between the main sections and the contact structures, contact sections adjoining the contact structures and having a higher dopant concentration than the main sections, wherein the contact sections of the body regions are buried in the silicon carbide body below the source regions such that the source regions separate the contact sections from the first surface, wherein both the contact sections of the body regions and the source regions contact a sidewall of the contact structure, wherein the gate structures and/or the contact structures are coplanar with the first surface of the silicon carbide body.

16. The semiconductor component of claim 15, wherein the Schottky contacts are formed in each case on mutually opposite sidewall sections of the contact structure and between the shielding region and the body region.

17. The semiconductor component of claim 15, wherein the gate structures comprise a gate dielectric and a gate electrode, and wherein the gate electrode comprises first sections of a metal structure that adjoin the gate dielectric.

18. The semiconductor component of claim 17, wherein the contact structures form second sections of the metal structure that adjoin the silicon carbide body.

19. A semiconductor component, comprising:
gate structures extending into a silicon carbide body from a first surface, the gate structures comprising a gate dielectric and a gate electrode, the gate electrode comprising first sections of a metal structure that adjoin the gate dielectric;

contact structures extending into the silicon carbide body from the first surface, the gate structures and the contact structures alternating with one another along a first horizontal direction parallel to the first surface, and the contact structures comprising second sections of the metal structure that adjoin the silicon carbide body;

shielding regions which, in the silicon carbide body, adjoin a bottom of the contact structures and are spaced apart from the gate structures along the first horizontal direction; and source regions between the first surface and body regions, wherein the body regions form pn junctions with the source regions, wherein the body regions comprise main sections adjoining the gate structures and, between the main sections and the contact structures, contact sections adjoining the contact structures and having a higher dopant concentration than the main sections, wherein the contact sections of the body regions are buried in the silicon carbide body below the source regions such that the source regions separate the contact sections from the first surface, wherein both the contact sections of the body regions and the source regions contact a sidewall of the contact structure, wherein the gate structures and/or the contact structures are coplanar with the first surface of the silicon carbide body.

20. The semiconductor component of claim 19, wherein a lateral width of the gate structures along the first horizontal direction is less than a vertical extent of the gate structures perpendicular to the first surface.

21. The semiconductor component of claim 19, wherein the metal structure comprises at least a first partial layer and a second partial layer, wherein a first section of the first partial layer in the gate structures adjoins the gate dielectric and a second section of the first partial layer in the contact structures adjoins the silicon carbide body, and wherein the second partial layer bears on the first and second sections of the first partial layer.

22. The semiconductor component of claim 21, wherein the first and second sections of the first partial layer have the same composition.

* * * * *

UNITED STATES PATENT AND TRADEMARK OFFICE
CERTIFICATE OF CORRECTION

Page 1 of 1

PATENT NO. : 11,043,560 B2
APPLICATION NO. : 16/205887
DATED : June 22, 2021
INVENTOR(S) : R. Siemieniec et al.

It is certified that error appears in the above-identified patent and that said Letters Patent is hereby corrected as shown below:

In the Claims

Column 17, Line 66, please change "and;" to -- and, --.

Column 18, Line 10, please change "structure" to -- structures --.

Column 19, Line 29, please change "structure" to -- structures --.

Column 20, Line 27, please change "structure" to -- structures --.

Signed and Sealed this
Seventeenth Day of August, 2021

Drew Hirshfeld
*Performing the Functions and Duties of the
Under Secretary of Commerce for Intellectual Property and
Director of the United States Patent and Trademark Office*